(12) United States Patent
Chuang et al.

(10) Patent No.:     US 12,648,436 B2
(45) Date of Patent:          Jun. 2, 2026

(54) SEMICONDUCTOR DEVICE HAVING AN INDUCTOR DISPOSED WITHIN A FIRST BONDING LAYER AND A SECOND BONDING LAYER

(71) Applicant: Taiwan Semiconductor Manufacturing Company, Ltd., Hsinchu (TW)

(72) Inventors: Harry-Haklay Chuang, Zhubei City (TW); Wen-Tuo Huang, Tainan City (TW); Li-Feng Teng, Hsinchu City (TW); Wei-Cheng Wu, Zhubei City (TW); Yu-Jen Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 500 days.

(21) Appl. No.: 18/162,071

(22) Filed: Jan. 31, 2023

(65) Prior Publication Data

US 2024/0071911 A1      Feb. 29, 2024

Related U.S. Application Data

(60) Provisional application No. 63/401,280, filed on Aug. 26, 2022.

(51) Int. Cl.
| | | |
|---|---|---|
| *H10W 20/40* | (2026.01) | |
| *H10W 44/00* | (2026.01) | |

(Continued)

(52) U.S. Cl.
CPC ....... *H10W 20/497* (2026.01); *H10W 44/501* (2026.01); *H10W 90/00* (2026.01);
(Continued)

(58) Field of Classification Search
CPC .............. H01L 23/5227; H01L 23/645; H01L 2224/80895; H01L 25/0657;
(Continued)

(56) References Cited

U.S. PATENT DOCUMENTS

| | | | |
|---|---|---|---|
| 11,043,470 B2 * | 6/2021 | Jing .................... | H01L 25/0652 |
| 2013/0241683 A1 * | 9/2013 | Tsai .................... | H01L 23/5225 |
| | | | 336/200 |

(Continued)

*Primary Examiner* — Khiem D Nguyen
(74) *Attorney, Agent, or Firm* — Eschweiler & Potashnik LLC

(57) ABSTRACT

A semiconductor device includes a first die having a first bonding layer; a second die having a second bonding layer disposed over and bonded to the first bonding layer; a plurality of bonding members, wherein each of the plurality of bonding members extends within the first bonding layer and the second bonding layer, wherein the plurality of bonding members includes a connecting member electrically connected to a first conductive pattern in the first die and a second conductive pattern in the second die, and a dummy member electrically isolated from the first conductive pattern and the second conductive pattern; and an inductor disposed within the first bonding layer and the second bonding layer. A method of manufacturing a semiconductor device includes bonding a first inductive coil of a first die to a second inductive coil of a second die to form an inductor.

20 Claims, 21 Drawing Sheets

(51) Int. Cl.
*H10W 90/00* (2026.01)
*H10W 72/00* (2026.01)
*H10W 90/20* (2026.01)

(52) U.S. Cl.
CPC ............ *H10W 72/01* (2026.01); *H10W 90/20* (2026.01); *H10W 90/732* (2026.01)

(58) Field of Classification Search
CPC ........... H01L 2224/80357; H10D 1/20; H10W 20/497; H10W 44/501; H10W 90/20; H10W 90/732
See application file for complete search history.

(56) References Cited

U.S. PATENT DOCUMENTS

| | | | |
|---|---|---|---|
| 2014/0252544 A1* | 9/2014 | Li | H01G 4/38 |
| | | | 257/532 |
| 2015/0255207 A1* | 9/2015 | Yen | H01L 23/528 |
| | | | 257/531 |
| 2019/0189562 A9 | 6/2019 | Yu et al. | |
| 2019/0244947 A1 | 8/2019 | Yu et al. | |
| 2020/0027790 A1* | 1/2020 | Huang | H01L 23/5227 |
| 2020/0075553 A1 | 3/2020 | Delacruz et al. | |
| 2020/0381396 A1 | 12/2020 | Chen et al. | |
| 2021/0066222 A1 | 3/2021 | Chen et al. | |
| 2021/0118827 A1* | 4/2021 | Chen | H01L 21/76879 |
| 2021/0307942 A1 | 10/2021 | Flora et al. | |
| 2021/0358891 A1 | 11/2021 | Chuang et al. | |
| 2022/0013480 A1 | 1/2022 | Chen et al. | |
| 2022/0052009 A1 | 2/2022 | Hauang et al. | |

* cited by examiner

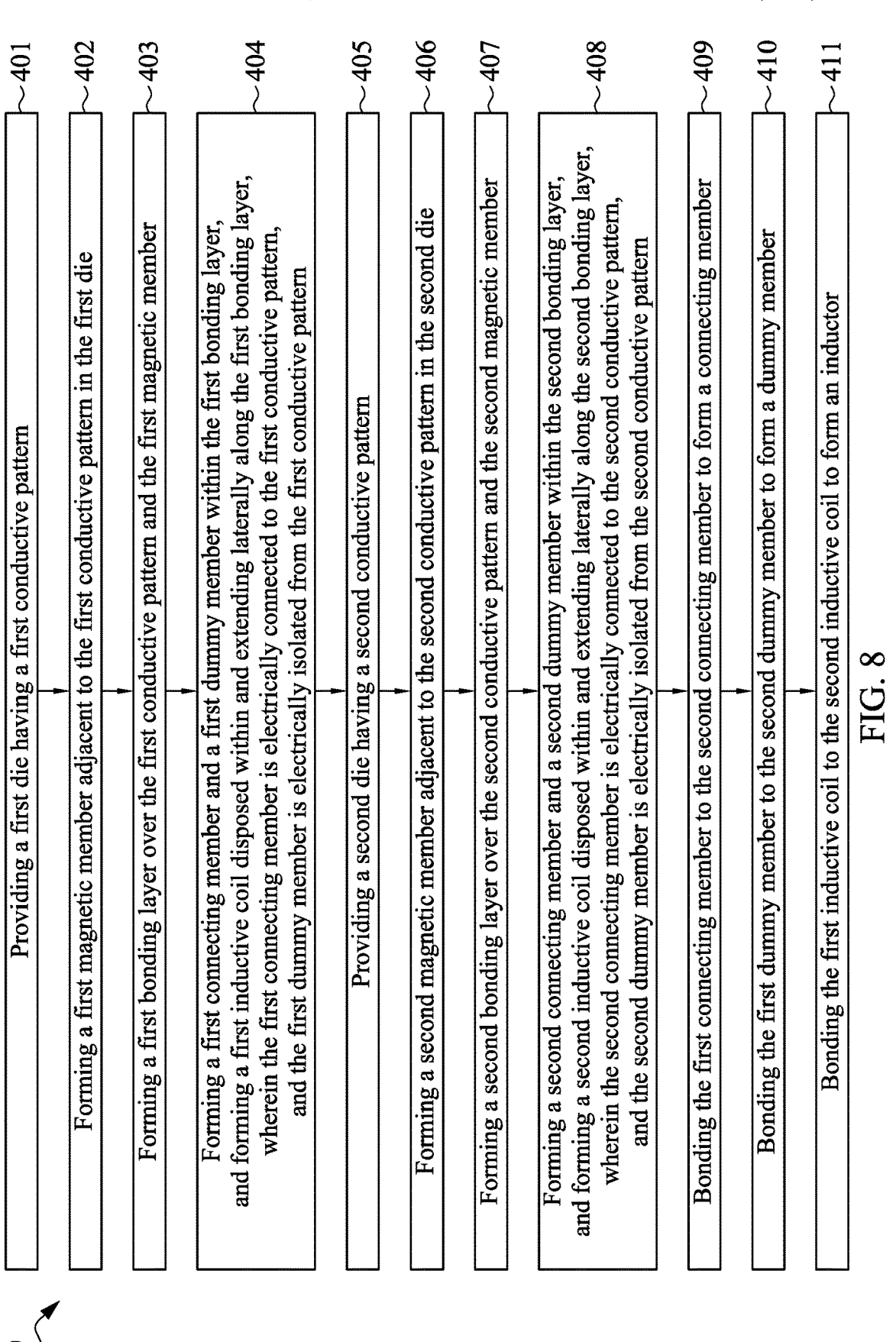

400

Providing a first die having a first conductive pattern ⟅401

Forming a first magnetic member adjacent to the first conductive pattern in the first die ⟅402

Forming a first bonding layer over the first conductive pattern and the first magnetic member ⟅403

Forming a first connecting member and a first dummy member within the first bonding layer, and forming a first inductive coil disposed within and extending laterally along the first bonding layer, wherein the first connecting member is electrically connected to the first conductive pattern, and the first dummy member is electrically isolated from the first conductive pattern ⟅404

Providing a second die having a second conductive pattern ⟅405

Forming a second magnetic member adjacent to the second conductive pattern in the second die ⟅406

Forming a second bonding layer over the second conductive pattern and the second magnetic member ⟅407

Forming a second connecting member and a second dummy member within the second bonding layer, and forming a second inductive coil disposed within and extending laterally along the second bonding layer, wherein the second connecting member is electrically connected to the second conductive pattern, and the second dummy member is electrically isolated from the second conductive pattern ⟅408

Bonding the first connecting member to the second connecting member to form a connecting member ⟅409

Bonding the first dummy member to the second dummy member to form a dummy member ⟅410

Bonding the first inductive coil to the second inductive coil to form an inductor ⟅411

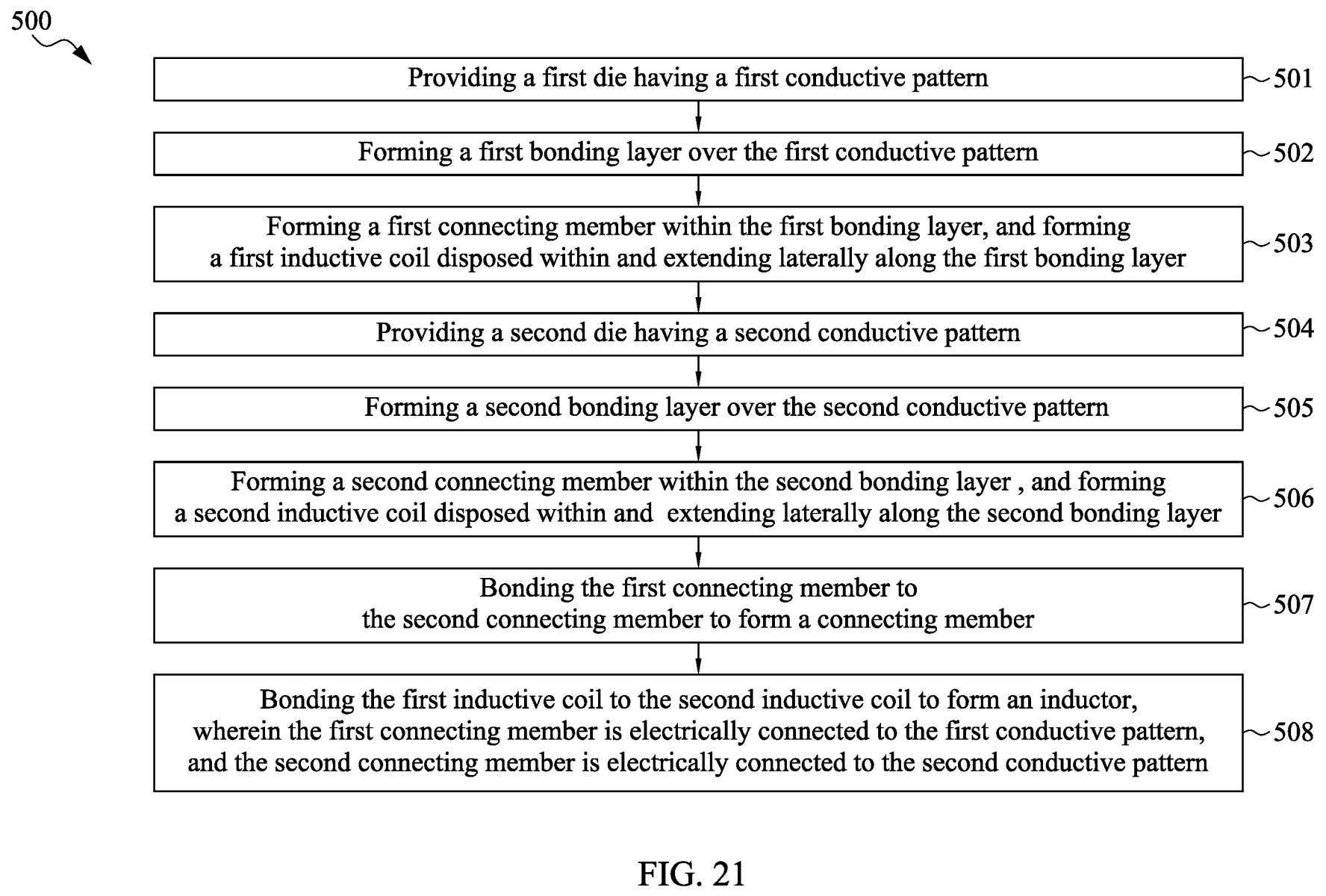

| 501 | Providing a first die having a first conductive pattern |

| 502 | Forming a first bonding layer over the first conductive pattern |

| 503 | Forming a first connecting member within the first bonding layer, and forming a first inductive coil disposed within and extending laterally along the first bonding layer |

| 504 | Providing a second die having a second conductive pattern |

| 505 | Forming a second bonding layer over the second conductive pattern |

| 506 | Forming a second connecting member within the second bonding layer, and forming a second inductive coil disposed within and extending laterally along the second bonding layer |

| 507 | Bonding the first connecting member to the second connecting member to form a connecting member |

| 508 | Bonding the first inductive coil to the second inductive coil to form an inductor, wherein the first connecting member is electrically connected to the first conductive pattern, and the second connecting member is electrically connected to the second conductive pattern |

FIG. 21

SEMICONDUCTOR DEVICE HAVING AN INDUCTOR DISPOSED WITHIN A FIRST BONDING LAYER AND A SECOND BONDING LAYER

PRIORITY CLAIM AND CROSS REFERENCE

This application claims the benefit of U.S. Provisional Application Ser. No. 63/401,280 filed on Aug. 26, 2022, which is hereby incorporated by reference in its entirety.

BACKGROUND

The semiconductor industry has experienced rapid growth due to ongoing improvements in integration density of a variety of components (e.g., photoelectric devices and electrical components). To accommodate miniaturized scales of semiconductor devices, various technologies and applications have been developed for wafer-level packaging, involving greater numbers of different components with different functions. Improvement in integration density has resulted from iterative reduction of minimum feature size, which allows more components to be integrated into a given area.

As semiconductor technologies further advance, stacked and bonded semiconductor devices have emerged as an effective alternative to further reduce physical sizes of semiconductor devices. In a stacked semiconductor device, active circuits such as logic, memory, and processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIG. 8 is a flow diagram of a method of manufacturing a semiconductor device in accordance with some embodiments of the present disclosure.

FIG. 21 is a flow diagram of a method of manufacturing a semiconductor device in accordance with some embodiments of the present disclosure.

DETAILED DESCRIPTION

Figure 1:
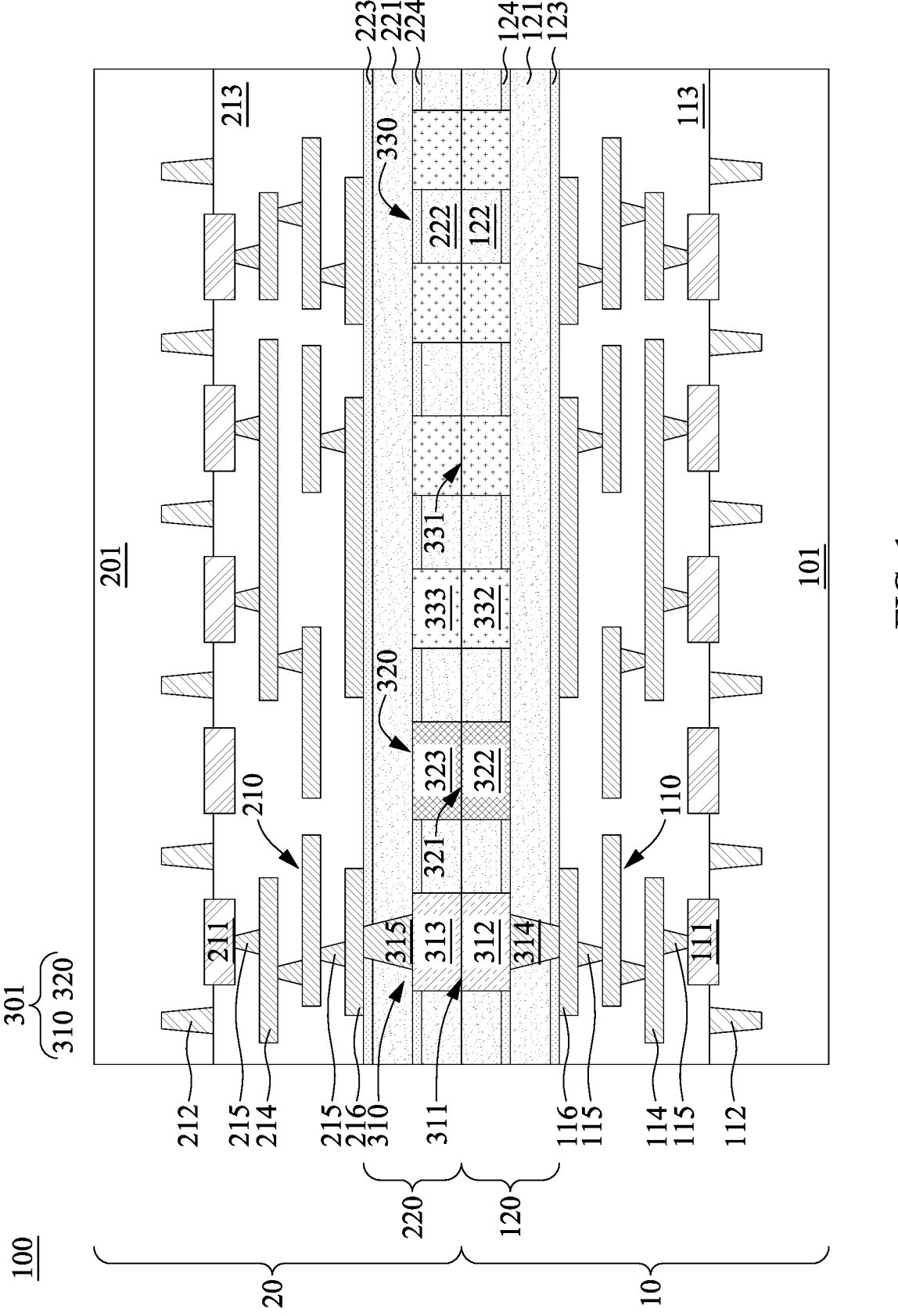
FIG. 1 is a cross-sectional view of a semiconductor device in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard variation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in verification testing of 3D packaging or 3DIC devices. The testing structures may include, for example, test pads formed in a redistribution layer or on a substrate that allows the testing of the 3D packaging or 3DIC, use of probes and/or probe cards, and the like. The verification testing may be performed on intermediate structures as well as a final structure. Additionally, the structures and methods disclosed herein may be used in conjunction with testing methodologies that incorporate intermediate verification of known good dies to increase yields and decrease costs.

In the present disclosure, a semiconductor device and a method of manufacturing a semiconductor device are provided. The semiconductor device includes a first die having a first bonding layer, a second die having a second bonding layer disposed over and bonded to the first bonding layer, a plurality of bonding members extending within the first bonding layer and the second bonding layer, and an inductor disposed within the first bonding layer and the second bonding layer. The plurality of bonding members include a connecting member electrically connected to a first conductive pattern in the first die and a second conductive pattern in the second die, and a dummy member electrically isolated from the first conductive pattern and the second conductive pattern. As a result, the inductor is disposed adjacent to the connecting member and the dummy member, and the bonding interface of the first die and the second die can therefore be effectively used.

In some embodiments, a method of manufacturing a semiconductor device includes providing a first die having a first conductive pattern; forming a first bonding layer over the first conductive pattern; forming a first connecting member within the first bonding layer; and forming a first inductive coil disposed within the first bonding layer. The method further includes providing a second die having a second conductive pattern; forming a second bonding layer over the second conductive pattern; forming a second connecting member within the second bonding layer; forming a second inductive coil disposed within the second bonding layer; bonding the first connecting member to the second connecting member to form a connecting member; and bonding the first inductive coil to the second inductive coil to form an inductor. The first connecting member is electrically connected to the first conductive pattern, and the second connecting member is electrically connected to the second conductive pattern. Other features and processes may also be included.

Figure 2:
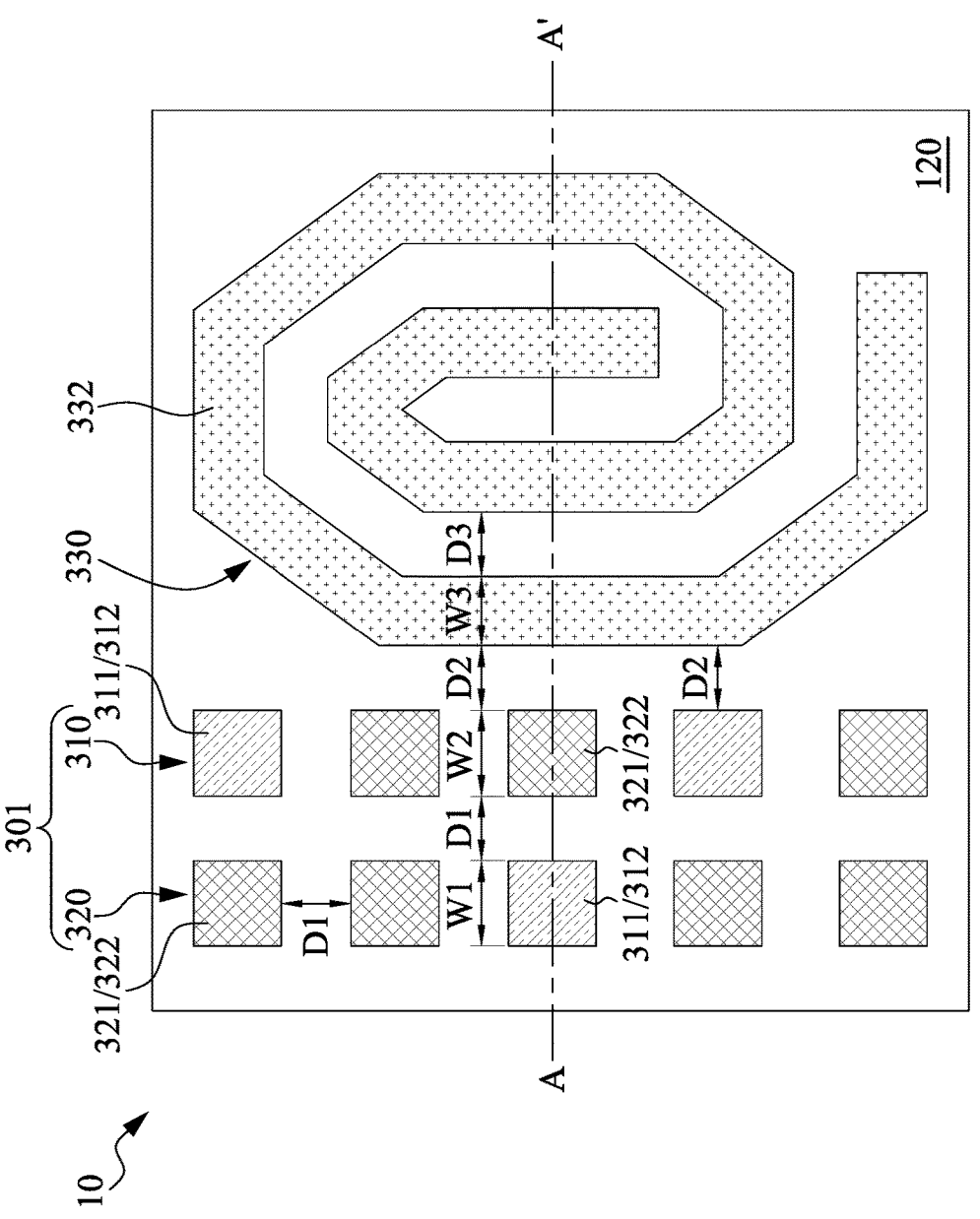
FIG. 2 is a top view of a portion of a semiconductor device in accordance with some embodiments of the present disclosure.
Figure 3:
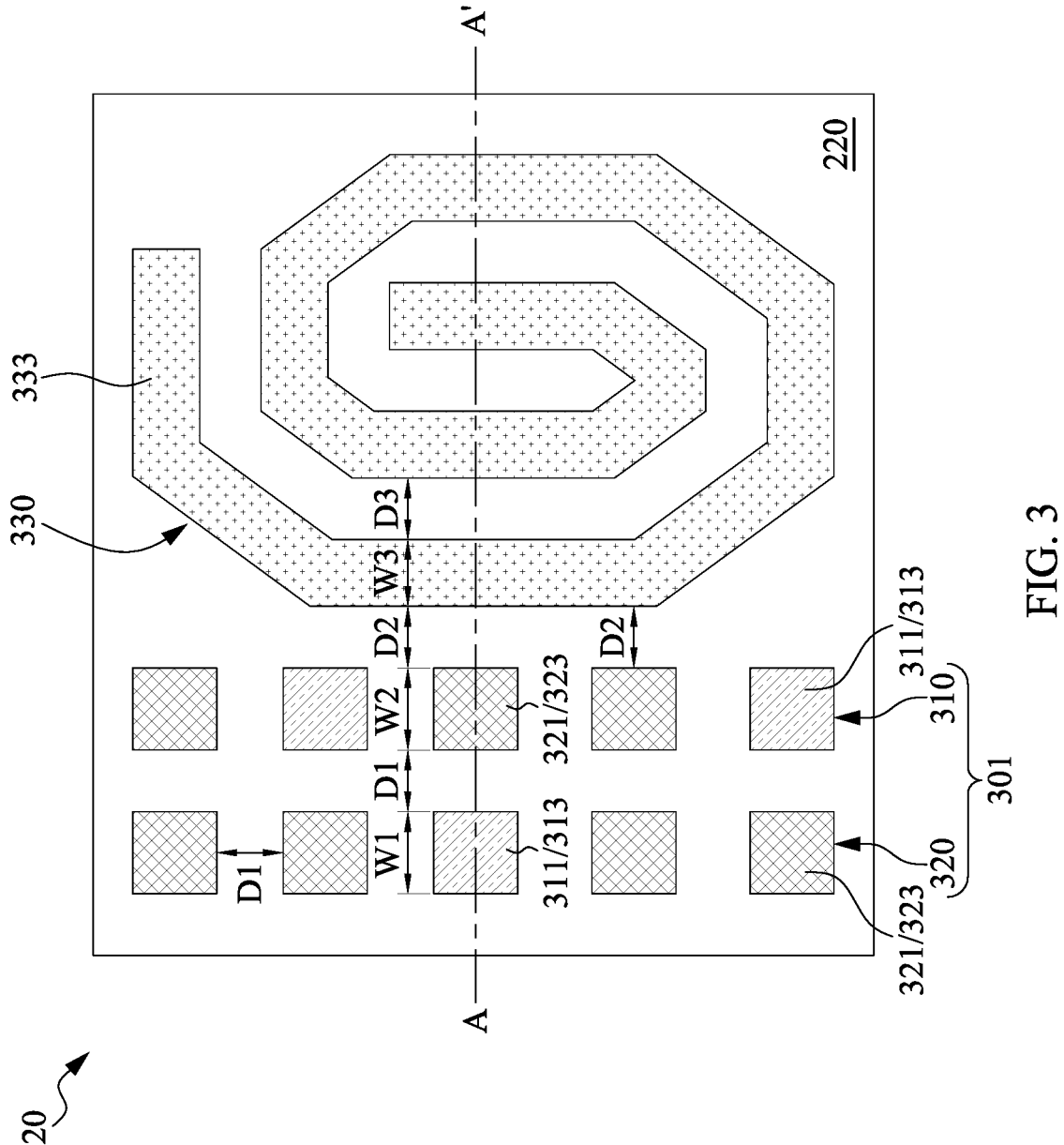
FIG. 3 is a top view of a portion of a semiconductor device in accordance with some embodiments of the present disclosure.

FIG. 1 is a cross-sectional view of a semiconductor device 100 in accordance with some embodiments of the present disclosure. FIG. 2 is a top view of a first die 10 of the semiconductor device 100 in accordance with some embodiments of the present disclosure. FIG. 3 is a top view of a second die 20 of the semiconductor device 100 in accordance with some embodiments of the present disclosure. FIG. 1 is a cross-sectional view of the semiconductor device 100 along lines A-A' in FIGS. 2 and 3.

Referring to FIGS. 1 to 3, the semiconductor device 100 includes the first die 10 having a first bonding layer 120, and the second die 20 having a second bonding layer 220 disposed over and bonded to the first bonding layer 120. The semiconductor device 100 includes a plurality of bonding members 301, wherein each of the plurality of bonding members 301 extends within the first bonding layer 120 and the second bonding layer 220, and an inductor 330 having a first inductive coil 332 disposed within the first bonding layer 120, and a second inductive coil 333 disposed within the second bonding layer 220. The plurality of bonding members 301 include a connecting member 310 and a dummy member 320. In some embodiments, the connecting member 310 and the dummy member 320 are disposed adjacent to the inductor 330.

In some embodiments, the first die 10 is a logic die, which may be a central processing unit (CPU) die, a micro-control unit (MCU) die, an input-output (IO) die, a baseband (BB) die, an application processor (AP) die, or the like. In some embodiments, the first die 10 is a memory die such as a dynamic random-access memory (DRAM) die or a static random-access memory (SRAM) die, or may be another type of die.

In some embodiments, the first die 10 includes a first semiconductor substrate 101 and a first interconnect structure 110 formed over a top surface of the first semiconductor substrate 101. In some embodiments, the first semiconductor substrate 101 is a semiconductor substrate, such as a bulk semiconductor, a semiconductor-on-insulator (SOI) substrate, or the like, and may be doped (e.g., with a p-type or an n-type dopant) or undoped. The first semiconductor substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the first semiconductor substrate 101 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In an embodiment, the first semiconductor substrate 101 is a silicon wafer.

In some embodiments, the first semiconductor substrate 101 has a plurality of devices 111 formed therein. The devices 111 may include active components (e.g., transistors, diodes, or the like) and/or passive components (e.g., resistors, capacitors, inductors, or the like). In some embodiments, the devices 111 are separated by shallow trench isolations (STI) 112 located between two adjacent devices 111. That is, in some embodiments, the STI 112 are also embedded in the first semiconductor substrate 101.

In some embodiments, a first dielectric layer 113 is disposed on the first semiconductor substrate 101 and surrounds the first interconnect structure 110. In some embodiments, the first dielectric layer 113 is an inter-metal dielectric (IMD).

In some embodiments, the first dielectric layer 113 includes low-k dielectric material. The dielectric constant (k value) of the low-k dielectric material may be lower than 3.0, or lower than about 2.5, and the dielectric material is therefore also referred to as an extreme low-k (ELK) dielectric material. In some embodiments, the first dielectric layer 113 includes a polymer, such as, for example, polyimide, polyBenzOxazole (PBO), benzocyclobutene (BCB), ajinomoto buildup film (ABF), solder resist film (SR), or the like. In some embodiments, the first dielectric layer 113 includes a plurality of dielectric sub-layers disposed over the first semiconductor substrate 101. The first dielectric layer 113, for example, may be formed by suitable fabrication techniques such as spin-on coating, chemical vapor deposition (CVD), plasma-enhanced chemical vapor deposition (PECVD), or the like.

In some embodiments, the semiconductor device 100 includes a plurality of first interconnect structures 110. In some embodiments, each of the first interconnect structures 110 includes a plurality of conductive patterns 114 and a plurality of conductive vias 115. In some embodiments, the conductive patterns 114 are embedded in the first dielectric layer 113. In some embodiments, the conductive vias 115 penetrate through one of the dielectric sub-layers of the first dielectric layer 113. In some embodiments, the conductive patterns 114 located at different heights are connected to each other through the conductive vias 115. In some embodiments, the conductive patterns 114 are formed in a stacked configuration, and the conductive vias 115 connect the conductive patterns 114. In some embodiments, the conductive patterns 114 are electrically connected to each other through the conductive vias 115. In some embodiments, the bottommost conductive vias 115 are connected to the device 111 embedded in the first semiconductor substrate 101. In other words, the bottommost conductive vias 115 establish electrical connection between the device 111 and the conductive patterns 114 of the first interconnection structure 110. In some embodiments, the bottommost conductive vias 115 may be referred to as contact structures of the device 111. In some embodiments, the first inductive coil 332 is electrically connected to one or more of the conductive patterns 114. For example, the first inductive coil 332 can be connected to the conductive patterns 114 through a via that directly contacts a lower surface of the first inductive coil 332, or the first inductive coil 332 can be connected to first connecting member 312 through a metal line extending laterally between first inductive coil 332 and first connecting member 312.

In some embodiments, a material of the conductive patterns 114 and the conductive vias 115 includes aluminum, titanium, copper, nickel, tungsten, or alloys thereof. The conductive patterns 114 and the conductive vias 115 may be formed by, for example, electroplating, deposition, and/or photolithography and etching. In some embodiments, the conductive patterns 114 and the underlying conductive vias 115 may be formed simultaneously. It should be noted that a number of the conductive patterns 114 and a number of the conductive vias 115 illustrated in FIG. 1 are merely for illustrative purposes, and the disclosure is not limited thereto. In some alternative embodiments, fewer or more of the conductive patterns 114, or the conductive vias 115 may be formed depending on the circuit design.

In some embodiments, each of the first interconnect structures 110 further includes a first conductive pattern 116 surrounded by the first dielectric layer 113. The first conductive pattern 116 electrically connects to the corresponding conductive patterns 114 and the conductive vias 115. In some embodiments, the first conductive pattern 116 is a topmost conductive pattern of the first interconnect structure 110.

In some embodiments, a first bonding layer 120 is disposed on the first dielectric layer 113 of the first die 10. The first bonding layer 120 is disposed between the first die 10 and the second die 20. The first bonding layer 120 includes dielectric material. The first bonding layer 120 may be formed of silicon oxide, silicon oxynitride, silicon oxycarbide, or the like. The first bonding layer 120 may be formed of a dielectric material similar to the dielectric material of the first dielectric layer 113. In some embodiments, the first bonding layer 120 is a single layer or multiple layers stacked over each other.

In some embodiments, the first bonding layer 120 includes a sub-layer 121 disposed on the first dielectric layer 113, and a sub-layer 122 is disposed on the sub-layer 121. A person having ordinary skill in the art would understand that a number of the sub-layers shown in FIG. 1 merely serves as an exemplary illustration, and different numbers of the sub-layers 121, 122 can be included. In some embodiments, the materials included in the sub-layers 121, 122 are the same material or different materials. In some embodiments, the sub-layers 121, 122 may include an oxide dielectric, such as a borophosphosilicate glass (BPSG), or other dielectric material. In some embodiments, the sub-layer 122 includes nitride dielectric. In some embodiments, the sub-layer 122 includes silicon nitride.

In some embodiments, the first bonding layer 120 includes an etch stop layer 123 disposed between the sub-layer 121 and the first dielectric layer 113, and an etch stop layer 124 disposed between the sub-layer 121 and the sub-layer 122.

In some embodiments, the second die 20 is a logic die, which may be a central processing unit (CPU) die, a micro-control unit (MCU) die, an input-output (IO) die, a baseband (BB) die, an application processor (AP) die, or the like. In some embodiments, the second die 20 is a memory die such as a dynamic random-access memory (DRAM) die or a static random-access memory (SRAM) die, or may be another type of die.

In some embodiments, the second die 20 includes a second semiconductor substrate 201 and a second interconnect structure 210 formed over a top surface of the second semiconductor substrate 201. In some embodiments, the second semiconductor substrate 201 is a semiconductor substrate, such as a bulk semiconductor, a semiconductor-on-insulator (SOI) substrate, or the like, and may be doped (e.g., with a p-type or an n-type dopant) or undoped. The second semiconductor substrate 201 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the second semiconductor substrate 201 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In an embodiment, the second semiconductor substrate 201 is a silicon wafer.

In some embodiments, the second semiconductor substrate 201 has a plurality of devices 211 formed therein. The devices 211 may include active components (e.g., transistors, diodes, or the like) and/or passive components (e.g., resistors, capacitors, inductors, or the like). In some embodiments, the devices 211 are separated by shallow trench isolations (STI) 212 located between two adjacent devices 211. That is, in some embodiments, the STI 212 are also embedded in the second semiconductor substrate 201.

In some embodiments, a second dielectric layer 213 is disposed on the second semiconductor substrate 201 and surrounds the second interconnect structure 210. In some embodiments, the second dielectric layer 213 is an inter-metal dielectric (IMD).

In some embodiments, the second dielectric layer 213 includes low-k dielectric material. The dielectric constant (k value) of the low-k dielectric material may be lower than 3.0, or lower than about 2.5, and the dielectric material is therefore also referred to as an extreme low-k (ELK) dielectric material. In some embodiments, the second dielectric layer 213 includes a polymer, such as, for example, polyimide, polyBenzOxazole (PBO), benzocyclobutene (BCB), ajinomoto buildup film (ABF), solder resist film (SR), or the like. In some embodiments, the second dielectric layer 213 includes a plurality of dielectric sub-layers disposed over the second semiconductor substrate 201. The second dielectric layer 213, for example, may be formed by suitable fabrication techniques such as spin-on coating, chemical vapor deposition (CVD), plasma-enhanced chemical vapor deposition (PECVD), or the like.

In some embodiments, the semiconductor device 100 includes a plurality of the second interconnect structures 210. In some embodiments, each of the second interconnect structures 210 includes a plurality of conductive patterns 214 and a plurality of conductive vias 215. In some embodiments, the conductive patterns 214 are embedded in the second dielectric layer 213. In some embodiments, the conductive vias 215 penetrate through one of the dielectric sub-layers of the second dielectric layer 213. In some embodiments, the conductive patterns 214 located at different heights are connected to each other through the conductive vias 215. In some embodiments, the conductive patterns 214 are formed in a stacked configuration, and the conductive vias 215 connect the conductive patterns 214. In some embodiments, the conductive patterns 214 are electrically connected to each other through the conductive vias 215. In some embodiments, the bottommost conductive vias 215 are connected to the device 211 embedded in the second semiconductor substrate 201. In other words, the bottommost conductive vias 215 establish electrical connection between the device 211 and the conductive patterns 214 of the second interconnection structure 210. In some embodiments, the bottommost conductive vias 215 may be referred to as contact structures of the device 211. In some embodiments, the second inductive coil 333 is electrically connected to one or more of the conductive patterns 214.

In some embodiments, a material of the conductive patterns 214 and the conductive vias 215 includes aluminum, titanium, copper, nickel, tungsten, or alloys thereof. The conductive patterns 214 and the conductive vias 215 may be formed by, for example, electroplating, deposition, and/or photolithography and etching. In some embodiments, the conductive patterns 214 and the underlying conductive vias 215 may be formed simultaneously. It should be noted that a number of the conductive patterns 214 and a number of the conductive vias 215 illustrated in FIG. 1 are merely for illustrative purposes, and the disclosure is not limited thereto. In some alternative embodiments, fewer or more of the conductive patterns 214 or the conductive vias 215 may be formed, depending on the circuit design.

In some embodiments, each of the second interconnect structures 210 further includes a second conductive pattern 216 surrounded by the second dielectric layer 213. The second conductive pattern 216 electrically connects to the corresponding conductive patterns 214 and the conductive vias 215. In some embodiments, the second conductive pattern 216 is a topmost conductive pattern of the second interconnect structure 210.

In some embodiments, a second bonding layer 220 is disposed on the second dielectric layer 213 of the second die 20. The second bonding layer 220 is disposed between the first die 10 and the second die 20. The second bonding layer 220 includes dielectric material. The second bonding layer 220 may be formed of silicon oxide, silicon oxynitride, silicon oxy-carbide, or the like. The second bonding layer 220 may be formed of a dielectric material similar to the dielectric material of the second dielectric layer 213. In some embodiments, the second bonding layer 220 is a single layer or multiple layers stacked over each other.

In some embodiments, the second bonding layer 220 includes a sub-layer 221 disposed on the second dielectric layer 213, and a sub-layer 222 is disposed on the sub-layer 221. A person having ordinary skill in the art would understand that a number of the sub-layers shown in FIG. 1 merely serves as an exemplary illustration, and different numbers of the sub-layers 221, 222 can be included. In some embodiments, the materials included in the sub-layers 221, 222 are a same material or different materials. In some embodiments, the sub-layers 221, 222 may include an oxide dielectric, such as a borophosphosilicate glass (BPSG), or other dielectric material. In some embodiments, the sub-layer 222 includes nitride dielectric. In some embodiments, the sub-layer 222 includes silicon nitride. In some embodiments, the sub-layer 222 of the second bonding layer 220 is bonded to and in contact with the sub-layer 122 of the first bonding layer 120.

In some embodiments, the second bonding layer 220 includes an etch stop layer 223 disposed between the sub-layer 221 and the second dielectric layer 213, and an etch stop layer 224 disposed between the sub-layer 221 and the sub-layer 222.

In some embodiments, the plurality of bonding members 301 are surrounded by the first bonding layer 120 and the second bonding layer 220. In some embodiments, each of the plurality of bonding members 301 extends within the sub-layer 122 of the first bonding layer 120 and the sub-layer 222 of the second bonding layer 220. In some embodiments, each of the plurality of bonding members 301 is disposed between the first interconnect structure 110 and the second interconnect structure 210.

In some embodiments, the plurality of bonding members 301 include a plurality of connecting members 310 and a plurality of dummy members 320. In some embodiments, the dummy members 320 are disposed adjacent to the connecting members 310. In some embodiments, a number of the dummy members 320 is greater than a number of the connecting members 310. In some embodiments, the number of the dummy members 320 is more than twice the number of the connecting members 310. In some embodiments, a first distance D1 between adjacent bonding members 301 is between 0.4 μm and 10 μm. In some embodiments, a portion of the first bonding layer 120 and a portion of the second bonding layer 220 are disposed between adjacent bonding members 301, and the first die 10 and the second die 20 are hybrid bonded to each other. In some embodiments, a plurality of first bonding members are disposed within the first bonding layer 120, and a plurality of second bonding members are disposed within the second bonding layer 220 and bonded with the plurality of first bonding members respectively.

In some embodiments, each of the connecting members 310 is electrically connected to one of the first interconnect structures 110 of the first die 10 and one of the second interconnect structures 210 of the second die 20. In some embodiments, each of the connecting members 310 is electrically connected to the first conductive pattern 116 of the first die 10 and the second conductive pattern 216 of the second die 20.

In some embodiments, each of the connecting members 310 includes a first connecting member 312 disposed within the first bonding layer 120, and a second connecting member 313 disposed within the second bonding layer 220 and bonded with the corresponding first connecting member 312. The first connecting member 312 and the corresponding second connecting member 313 are collectively referred to as one connecting member 310. In some embodiments, the first bonding layer 120 surrounds the first connecting members 312. In some embodiments, the second bonding layer 220 surrounds the second connecting members 313.

In some embodiments, at least a portion of each of the first connecting members 312 is exposed through the first bonding layer 120. In some embodiments, each of the first connecting members 312 optionally connects to the corresponding first conductive pattern 116 through a conductive via 314, wherein the conductive via 314 is disposed between the first connecting member 312 and the corresponding first conductive pattern 116. In some embodiments, a material of the conductive via 314 includes aluminum, titanium, copper, nickel, tungsten, or alloys thereof. In some embodiments, a material of the first connecting member 312 includes aluminum, titanium, copper, nickel, tungsten, or alloys thereof. Each of the conductive via 314 and the corresponding first connecting member 312 may be formed using a dual damascene process, which includes forming via openings in the sub-layer 121 and the etch stop layer 123 of the first bonding layer 120, forming trenches in the sub-layer 122 and the etch stop layer 124 of the first bonding layer 120, and filling the via openings and the trenches with conductive materials. A planarization process such as a CMP process or a mechanical grinding process is performed to level top surfaces of the first bonding layer 120 and the first connecting member 312. The filling of the openings and the trenches with the conductive materials may include depositing a diffusion barrier such as a titanium nitride layer, a tantalum nitride layer, a titanium layer, a tantalum layer, or the like, and depositing a copper-containing material over the diffusion barrier.

In some embodiments, at least a portion of each of the second connecting members 313 is exposed through the second bonding layer 220. In some embodiments, each of the second connecting members 313 optionally connects to the corresponding second conductive pattern 216 through a conductive via 315, wherein the conductive via 315 is disposed between the second connecting member 313 and the corresponding second conductive pattern 216. In some embodiments, a material of the conductive via 315 includes aluminum, titanium, copper, nickel, tungsten, or alloys thereof. In some embodiments, a material of the second connecting member 313 includes aluminum, titanium, copper, nickel, tungsten, or alloys thereof. Each of the conductive vias 315 and the corresponding second connecting member 313 may be formed using a dual damascene process, and a planarization process such as a CMP process or a mechanical grinding process may be performed to level top surfaces of the second bonding layer 220 and the second connecting member 313. In some embodiments, the second connecting members 313 and the corresponding conductive vias 315 may be surrounded by a diffusion barrier such as a titanium nitride layer, a tantalum nitride layer, a titanium layer, a tantalum layer, or the like.

In some embodiments, the first die 10 is electrically coupled to the second die 20. In some embodiments, the first die 10 and the second die 20 are electrically connected through the plurality of connecting members 310. In some embodiments, the first connecting member 312 of the first die 10 is electrically coupled to the second die 20. In some embodiments, the second connecting member 313 of the second die 20 is electrically coupled to the first die 10.

In some embodiments, each of the first connecting members 312 is vertically aligned with and in direct contact with a corresponding one of the second connecting members 313. In some embodiments, each of the second connecting members 313 is bonded over and aligned with a corresponding one of the first connecting members 312. In some embodiments, a first bonding interface 311 is disposed within each of the connecting members 310. In some embodiments, each of the first bonding interfaces 311 is disposed between the first connecting members 312 and the corresponding second connecting members 313. In some embodiments, a first width W1 of each of the connecting members 310 is between 0.5 µm and 2 µm. In some embodiments, when the first width W1 is greater than 2 µm, each of the connecting members 310 takes up too much space. In some embodiments, when the first width W1 is less than 0.5 µm, a reliability of each of the connecting members decreases.

In some embodiments, each of the dummy members 320 is electrically isolated from the first interconnect structures 110 of the first die 10 and the second interconnect structures 210 of the second die 20. In some embodiments, each of the dummy members 320 is electrically isolated from the first conductive pattern 116 of the first die 10 and the second conductive pattern 216 of the second die 20. In some embodiments, the dummy members 320 are not electrically connected to the first conductive pattern 116 and the second conductive pattern 216.

In some embodiments, each of the dummy members 320 includes a first dummy member 322 disposed within the first bonding layer 120, and a second dummy member 323 disposed within the second bonding layer 220 and bonded with the corresponding first dummy member 322. The first dummy member 322 and the corresponding second dummy member 323 are collectively referred to as one dummy member 320. In some embodiments, the first bonding layer 120 surrounds the first dummy members 322. In some embodiments, the second bonding layer 220 surrounds the second dummy members 323.

In some embodiments, at least a portion of each of the first dummy members 322 is exposed through the first bonding layer 120. Each of the first dummy members 322 may include conductive materials. In some embodiments, a conductive material of the first dummy members 322 includes aluminum, titanium, copper, nickel, tungsten, or alloys thereof. The conductive material included in the first dummy members 322 may be similar to or different from the conductive material included in the first connecting members 312.

In some embodiments, at least a portion of each of the second dummy members 323 is exposed through the second bonding layer 220. Each of the second dummy members 323 may include conductive materials. In some embodiments, a conductive material of the second dummy members 323 includes aluminum, titanium, copper, nickel, tungsten, or alloys thereof. The conductive material included in the second dummy members 323 may be similar to or different from the conductive material included in the second connecting members 313.

In some embodiments, each of the first dummy members 322 is vertically aligned with and in direct contact with a corresponding one of the second dummy members 323. In some embodiments, each of the second dummy members 323 is bonded over and aligned with a corresponding one of the first dummy members 322. In some embodiments, a second bonding interface 321 is disposed within each of the dummy members 320. In some embodiments, each of the second bonding interfaces 321 is disposed between the first dummy member 322 and a corresponding second dummy member 323. In some embodiments, the second bonding interface 321 is substantially coplanar with the first bonding interface 311. In some embodiments, a second width W2 of each of the dummy members is between 0.5 μm and 2 μm. In some embodiments, when the second width W2 is greater than 2 μm, each of the dummy members takes up too much space. In some embodiments, when the second width W2 is less than 0.5 μm, each of the dummy members is not easy to set in a specific position.

In some embodiments, the inductor 330 is disposed adjacent to the plurality of bonding members 301. In some embodiments, the inductor 330 is disposed within and extends laterally along the first bonding layer 120 and the second bonding layer 220. In some embodiments, the inductor 330 is disposed between the first interconnect structures 110 of the first die 10 and the second interconnect structures 210 of the second die 20. In some embodiments, the inductor 330 is disposed between the first conductive pattern 116 of the first die 10 and the second conductive pattern 216 of the second die 20. In some embodiments, the semiconductor device 100 includes a plurality of the inductors 330. It should be noted that a number of the inductor 330 illustrated in FIGS. 1 to 3 is merely for illustrative purposes, and the disclosure is not limited thereto. In some alternative embodiments, a plurality of the inductors 330 may be formed depending on the circuit design.

In some embodiments, the first inductive coil 332 and the second inductive coil 333 collectively form the inductor 330. In some embodiments, the first bonding layer 120 surrounds the first inductive coil 332. In some embodiments, the second bonding layer 220 surrounds the second inductive coil 333.

In some embodiments, at least a portion of the first inductive coil 332 is exposed through the first bonding layer 120. The first inductive coil 332 includes conductive material. The conductive material included in the first inductive coil 332 may be similar to or different from the conductive material included in first connecting members 312.

In some embodiments, at least a portion of each of the second inductive coils 333 is exposed through the second bonding layer 220. The second inductive coil 333 includes conductive material. The conductive material included in the second inductive coil 333 may be similar to or different from the conductive material included in second connecting members 313.

In some embodiments, the first inductive coil 332 is vertically aligned with and in direct contact with the second inductive coil 333. In some embodiments, the second inductive coil 333 is bonded over and aligned with a corresponding one of the first inductive coil 332. In some embodiments, a third bonding interface 331 is disposed within the inductor 330. In some embodiments, the third bonding interface 331 is disposed between the first inductive coil 332 and the second inductive coil 333. In some embodiments, the third bonding interface 331 is substantially coplanar with the first bonding interface 311 and the second bonding interface 321.

In some embodiments, the inductor 330 has a coil configuration from a top view perspective. In some embodiments, the coil configuration is integral and continuous. In some embodiments, each of the first inductive coil 332 and the second inductive coil 333 has a coil configuration from a top view perspective. In some embodiments, the first inductive coil 332 is a mirror or flipped pattern of the second inductive coil 333 from the top view perspective. In some embodiments, the first inductive coil 332 is entirely in contact with the second inductive coil 333. In some embodiments, a third width W3 of a strip of the coil of the inductor 330 is between 0.4 μm and 10 μm, and preferably between 0.4 μm and 5 μm. In some embodiments, when the third width W3 is greater than 10 μm, the inductor 330 takes up too much space. In some embodiments, when the third width W3 is less than 0.4 μm, a reliability of the inductor 330 decreases.

In some embodiments, a second distance D2 between the inductor 330 and the bonding member 301 adjacent to the inductor 330 is between 0.4 μm and 10 μm, and is preferably between 0.4 μm and 5 μm. In some embodiments, when the second distance D2 is greater than 10 μm, much space between the inductor 330 and the bonding member 301 left unused. In some embodiments, when the second distance D2 is less than 0.4 μm, a reliability of the semiconductor device 100 decreases. In some embodiments, a portion of the first bonding layer 120 and a portion of the second bonding layer 220 are disposed within the coil of the inductor 330. In some embodiments, a third distance D3 between an outer coil and an inner coil of the inductor 330 is between 0.4 μm and 10 μm, and is preferably between 0.4 μm and 5 μm. In some embodiments, when the third distance D3 is greater than 10 μm, the inductor 330 takes up too much space. In some embodiments, when the third distance D3 is less than 0.4 μm, a reliability of the inductor 330 decreases.

In some embodiments, a total area of the first bonding interface 311, the second bonding interface 321 and the third bonding interface 331 is less than 40% of a total surface area of the first bonding layer 120 or a total surface area of the second bonding layer 220. In some embodiments, the total area of the first bonding interface 311, the second bonding interface 321 and the third bonding interface 331 is between 20% and 40% of the total surface area of the first bonding layer 120 or the total surface area of the second bonding layer 220.

Figure 4:
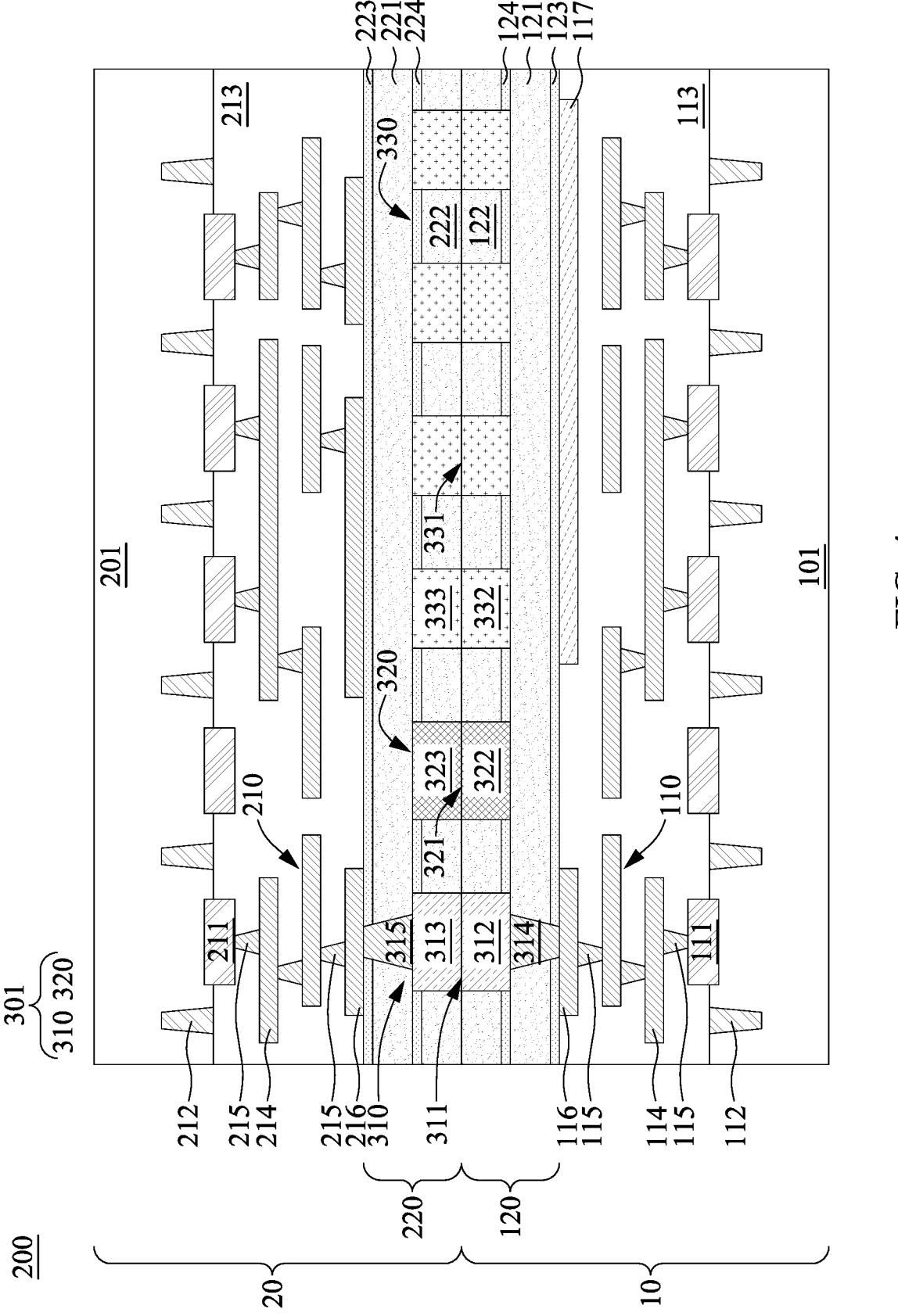
FIG. 4 is a cross-sectional view of a semiconductor device in accordance with some embodiments of the present disclosure.
Figure 5:
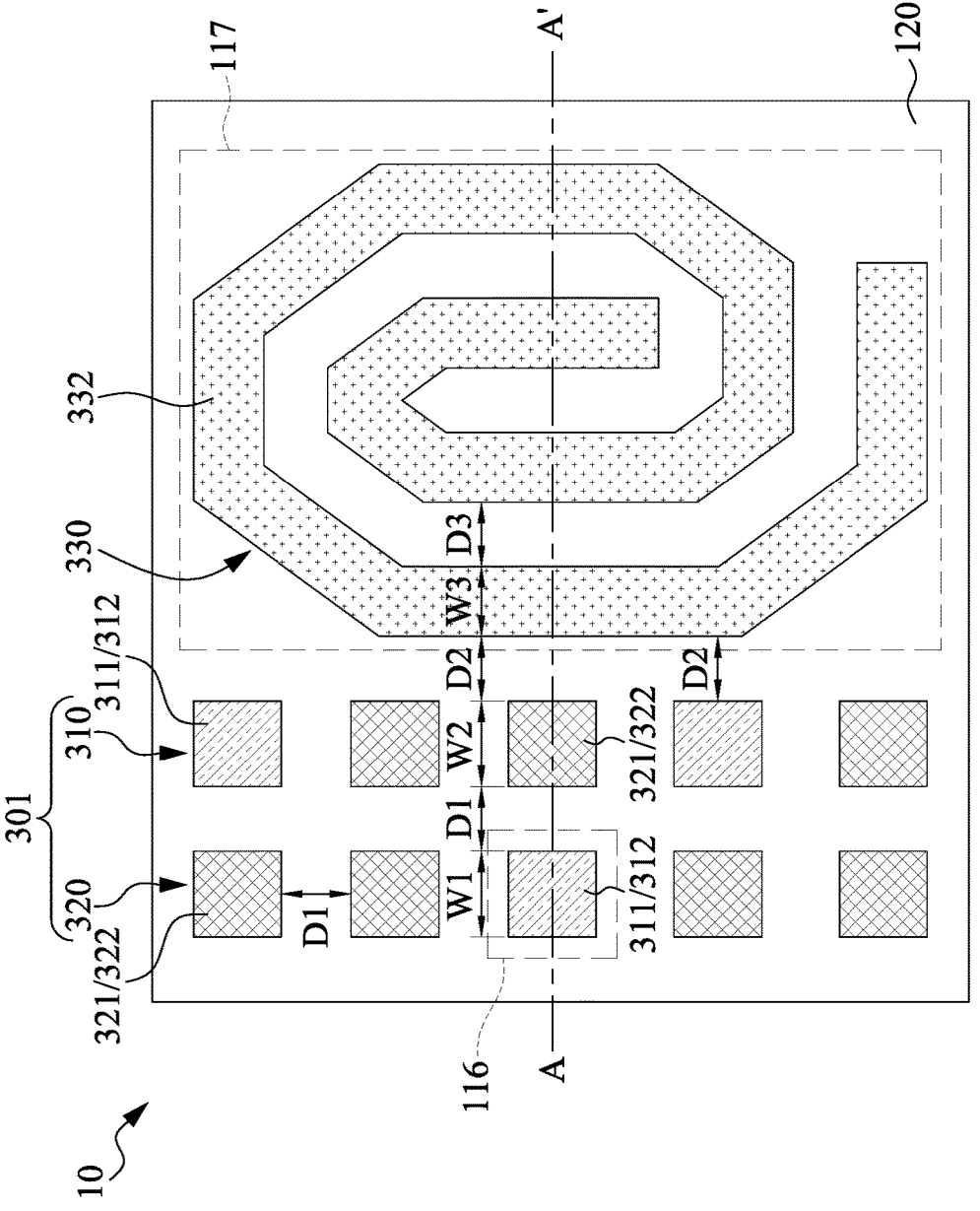
FIG. 5 is a top view of a portion of a semiconductor device in accordance with some embodiments of the present disclosure.

FIG. 4 is a cross-sectional view of a semiconductor device 200 in accordance with some embodiments of the present disclosure. FIG. 5 is a top view of a first die 10 of the semiconductor device 200 in accordance with some embodiments of the present disclosure. FIG. 4 is a cross-sectional view of the semiconductor device 200 along lines A-A' in FIGS. 3 and 5.

In some embodiments, the semiconductor device 200 shown in FIGS. 4 and 5 is similar to the semiconductor device 100 shown in FIGS. 1 to 3 except that one of the first die 10 and the second die 20 further includes a magnetic member overlapped by the inductor 330 from a top view perspective, wherein the magnetic member is configured to improve inductance. In some embodiments, referring to FIGS. 4 and 5, the first die 10 of the semiconductor device 200 includes a first magnetic member 117 disposed adjacent to the first conductive pattern 116 and overlapped by the inductor 330 from a top view perspective. In some embodiments, at least a portion of the inductor 330 overlaps the first magnetic member 117 from a top view perspective. In some embodiments, the entire inductor 330 overlaps the first magnetic member 117 from a top view perspective.

In some embodiments, the first magnetic member 117 is electrically isolated from the first interconnect structure 110. In some embodiments, the first magnetic member 117 is disposed between the first substrate 101 and the inductor 330. In some embodiments, the first magnetic member 117 is level with the first conductive pattern 116. In some embodiments, the sub-layer 121 of the first bonding layer 120 is disposed between the inductor 330 and the first magnetic member 117. In some embodiments, the first magnetic member 117 includes a magnetic material. In some embodiments, the magnetic material has a high magnetic permeability (e.g., a relative magnetic permeability over 50). In some embodiments, the first magnetic member 117 and the first conductive pattern 116 are made of different materials. In some embodiments, the magnetic permeability of the first magnetic member 117 is greater than that of the first conductive pattern 116.

Figure 6:
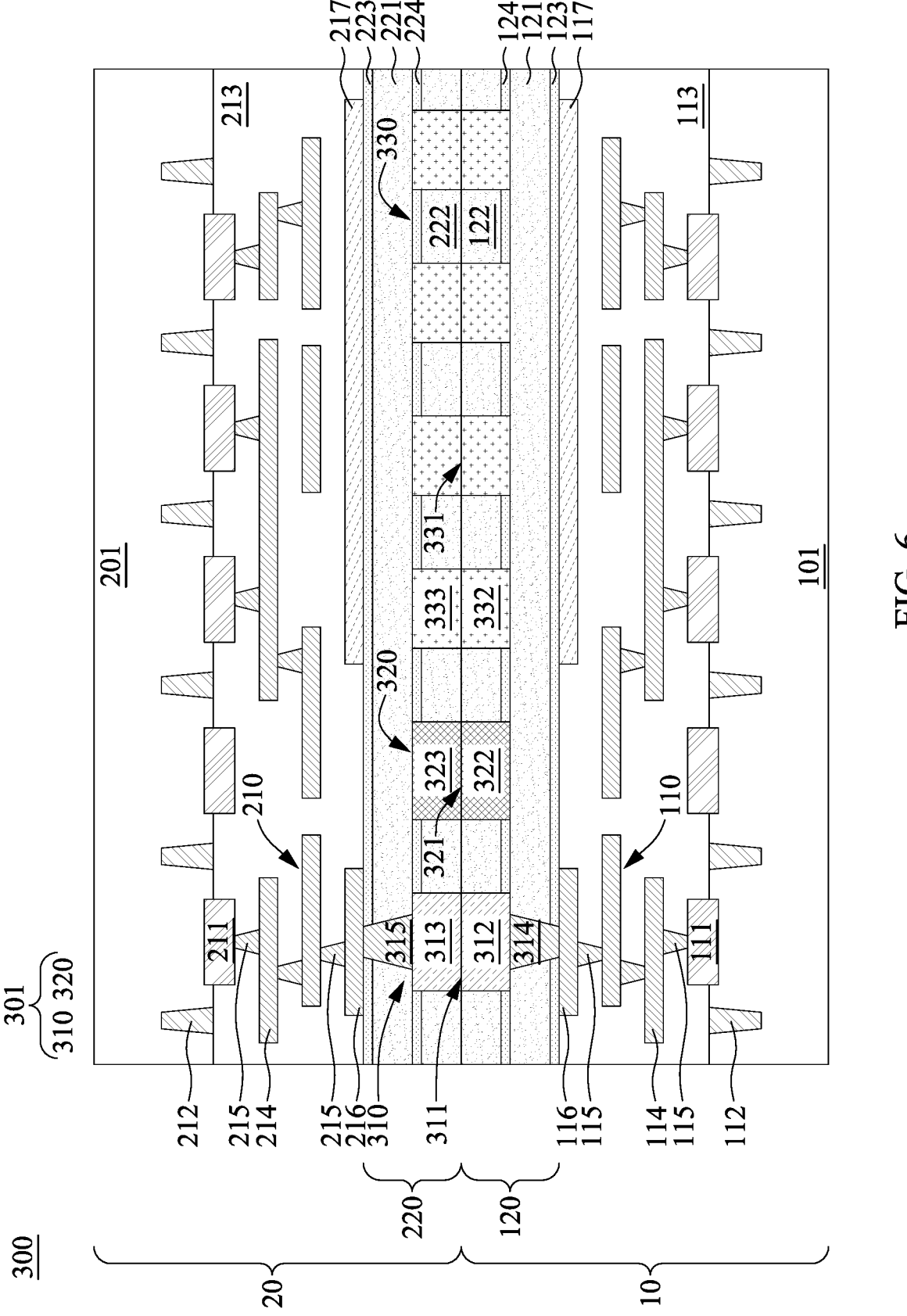
FIG. 6 is a cross-sectional view of a semiconductor device in accordance with some embodiments of the present disclosure.
Figure 7:
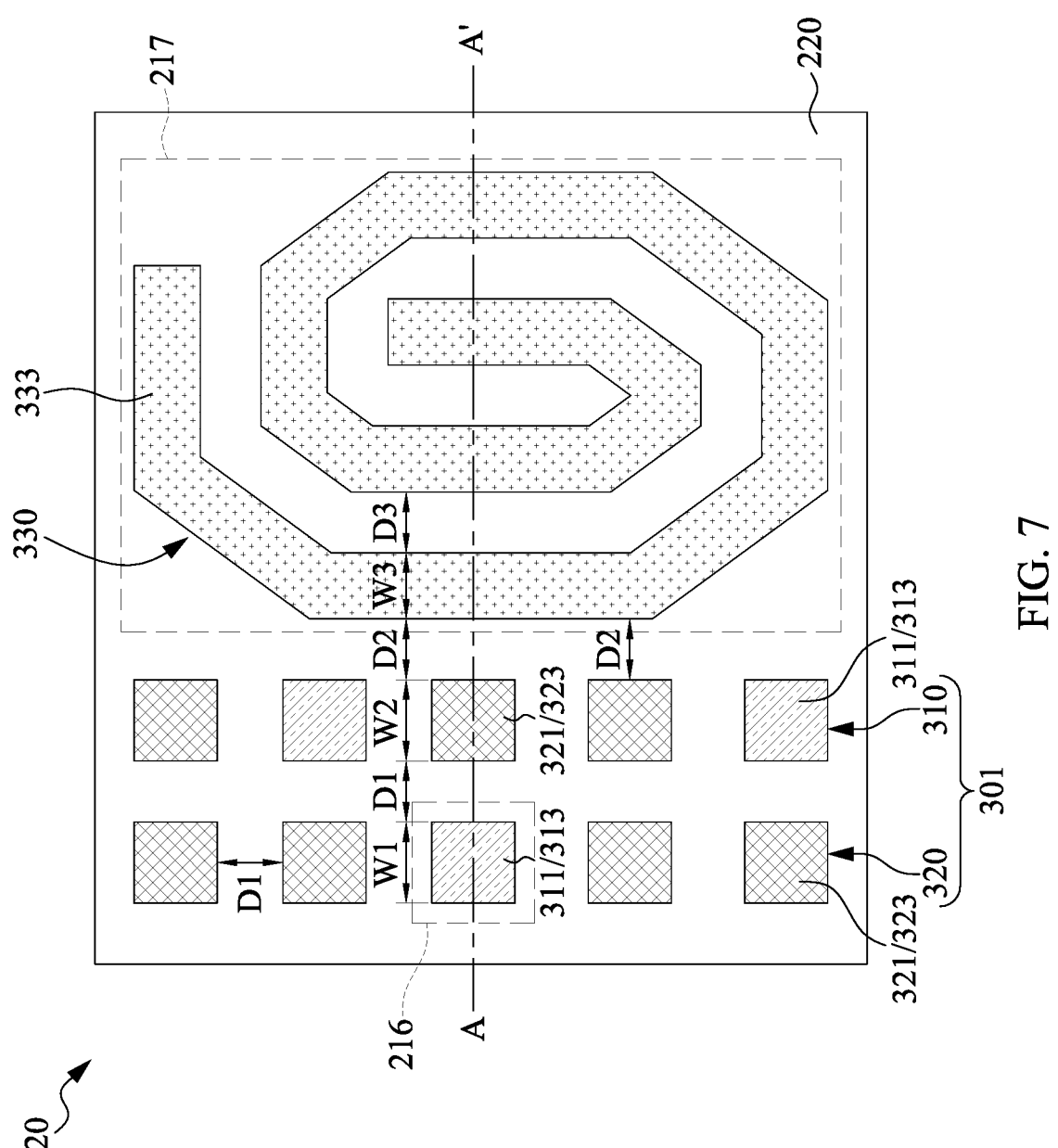
FIG. 7 is a top view of a portion of a semiconductor device in accordance with some embodiments of the present disclosure.

FIG. 6 is a cross-sectional view of a semiconductor device 300 in accordance with some embodiments of the present disclosure. FIG. 7 is a top view of a second die 20 of the semiconductor device 300 in accordance with some embodiments of the present disclosure. FIG. 6 is a cross-sectional view of the semiconductor device 200 along lines A-A' in FIGS. 5 and 7.

In some embodiments, the semiconductor device 300 shown in FIGS. 6 and 7 is similar to the semiconductor device 200 shown in FIGS. 4 and 5 except that each of the first die 10 and the second die 20 includes a magnetic member overlapping or overlapped by the inductor 330 from a top view perspective. In some embodiments, referring to FIGS. 6 and 7, the second die 20 of the semiconductor device 300 includes a second magnetic member 217 configured to improve inductance. In some embodiments, the second magnetic member 217 is disposed adjacent to the second conductive pattern 216 and overlaps the inductor 330 from a top view perspective. In some embodiments, at least a portion of the inductor 330 is sandwiched between the first magnetic member 117 and the second magnetic member 217. In some embodiments, the entire inductor 330 is sandwiched between the first magnetic member 117 and the second magnetic member 217. In some embodiments, the second magnetic member 217 is electrically isolated from the second interconnect structure 210. In some embodiments, the second magnetic member 217 is disposed between the first substrate 201 and the inductor 330. In some embodiments, the second magnetic member 217 is level with the second conductive pattern 216. In some embodiments, the sub-layer 221 of the second bonding layer 220 is disposed between the inductor 330 and the second magnetic member 217. In some embodiments, the second magnetic member 217 includes a magnetic material. In some embodiments, the magnetic material has a high magnetic permeability (e.g., a relative magnetic permeability over 50). In some embodiments, the magnetic material included in the second magnetic member 217 is similar to or different from the magnetic material included in the first magnetic member 117.

In the present disclosure, a method of manufacturing the semiconductor devices 100, 200, 300 is also disclosed. In some embodiments, the semiconductor devices 100, 200, 300 are fabricated by a method 400. The method 400 includes a number of operations and the description and illustration are not deemed as a limitation to the sequence of operations. FIG. 8 is an embodiment of the method 400 of manufacturing the semiconductor device 100. The method 400 includes a number of operations (401 to 411). FIGS. 9 to 20 are cross-sectional views of one or more operations of the method for manufacturing a semiconductor device in accordance with some embodiments of the present disclosure.

Figure 9:
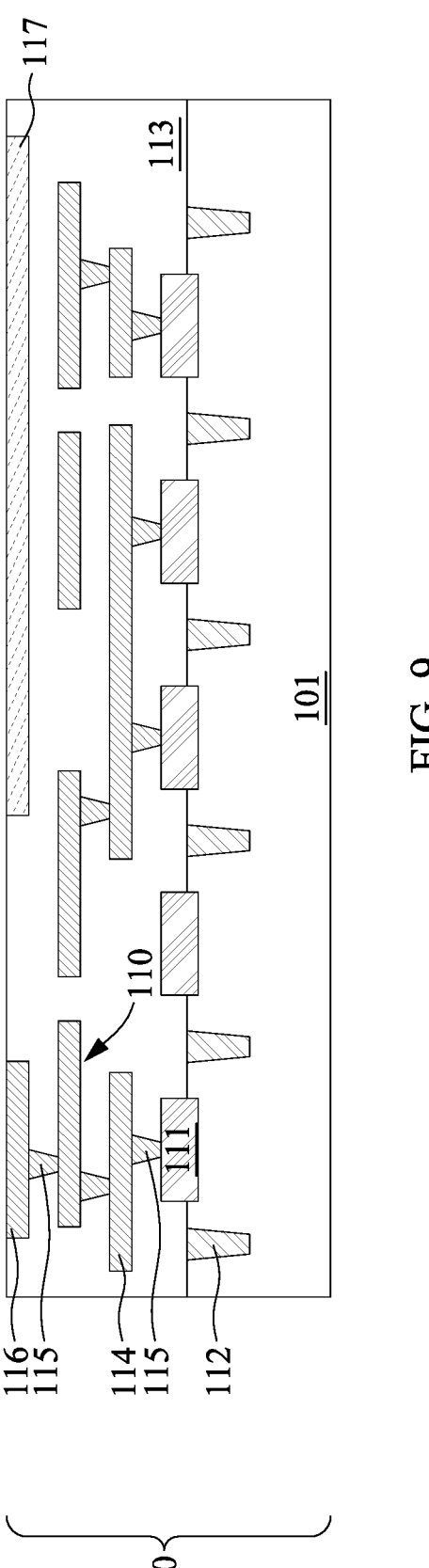
FIGS. 9 to 20 are cross-sectional views of one or more stages of the method of manufacturing a semiconductor device in accordance with some embodiments of the present disclosure.

In operation 401, referring to FIG. 9, a first die 10 having a first conductive pattern 116 is provided. In some embodiments, the first conductive pattern 116 is surrounded by a first dielectric layer 113 and electrically connected to a first interconnect structure 110. In some embodiments, at least a portion of the first conductive pattern 116 is exposed through the first dielectric layer 113.

In operation 402, a first magnetic member 117 is formed adjacent to the first conductive pattern 116 in the first die 10. In some embodiments, the first magnetic member 117 is omitted in the first die 10. In some embodiments, the first magnetic member 117 is surrounded by the first dielectric layer 113 and electrically isolated from the first interconnect structure 110. In some embodiments, at least a portion of the first magnetic member 117 is exposed through the first dielectric layer 113.

Figure 10:
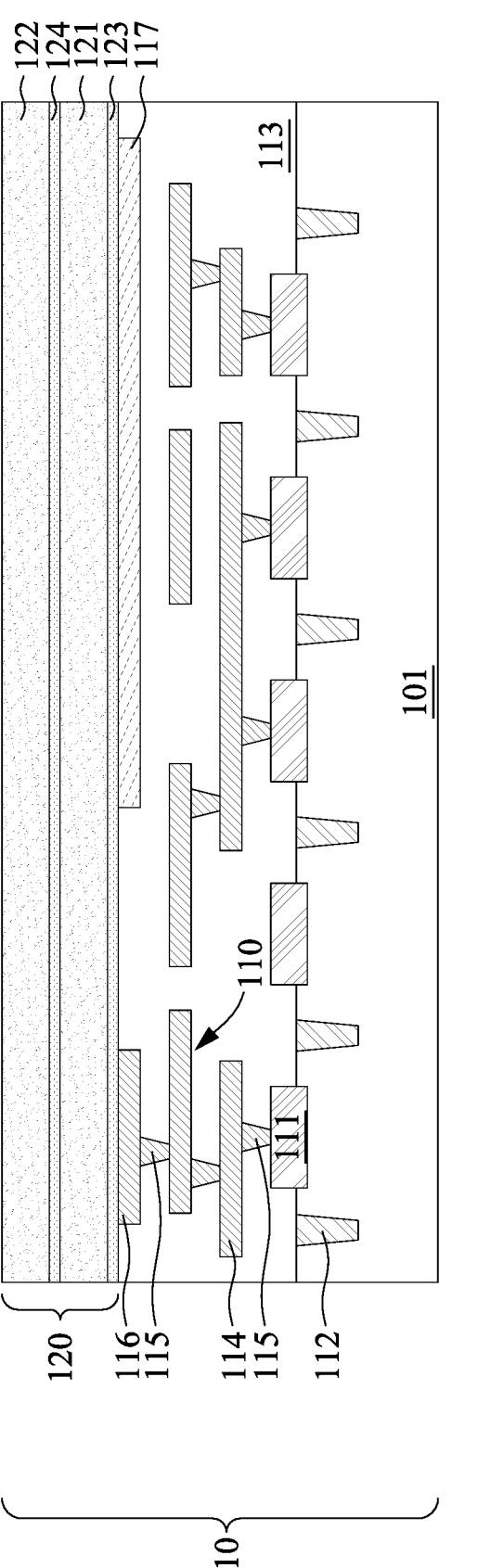

In operation 403, referring to FIG. 10, a first bonding layer 120 is formed over the first conductive pattern 116 and the first magnetic member 117. In some embodiments, an etch stop layer 123 is formed over the first conductive pattern 116 and the first magnetic member 117, a sub-layer 121 including a dielectric material is formed over the etch stop layer 123, an etch stop layer 124 is formed over the sub-layer 121, and a sub-layer 122 including a dielectric material is formed over the etch stop layer 124 and the sub-layer 121. The first bonding layer 120, for example, may be formed by suitable fabrication techniques such as spin-on coating, chemical vapor deposition (CVD), plasma-enhanced chemical vapor deposition (PECVD), or the like.

In operation 404, a first connecting member 312 and a first dummy member 322 are formed within the first bonding layer 120, and a first inductive coil 332 is formed within and extends laterally along the first bonding layer 120, wherein the first connecting member 312 is electrically connected to the first conductive pattern 116, and the first dummy member 322 is electrically isolated from the first conductive pattern 116.

Figure 11:
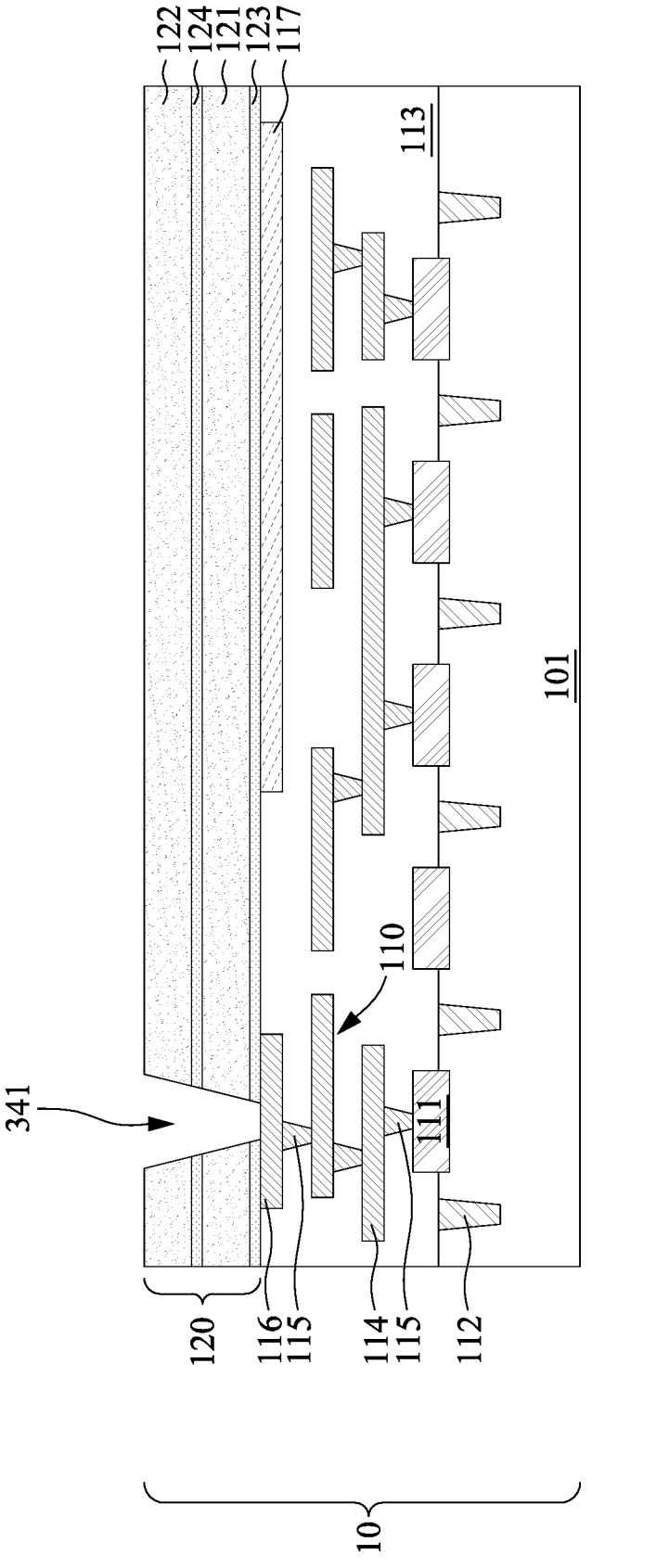

In some embodiments, referring to FIG. 11, a first recess 341 is formed in the first bonding layer 120. In some embodiments, a portion of the first bonding layer 120 is removed to form the first recess 341. In some embodiments, the first recess 341 is a via-opening. In some embodiments, a plurality of first recesses 341 are formed. The portion of the first bonding layer 120 may be removed by a stripping process and/or an etching process. In some embodiments, the first recess 341 is formed to have a depth similar to or less than a thickness of the first bonding layer 120. In some embodiments, the first recess 341 exposes a portion of the first conductive pattern 116. In some embodiments, the first recess 341 and the first magnetic member 117 are offset from a top view.

Figure 12:
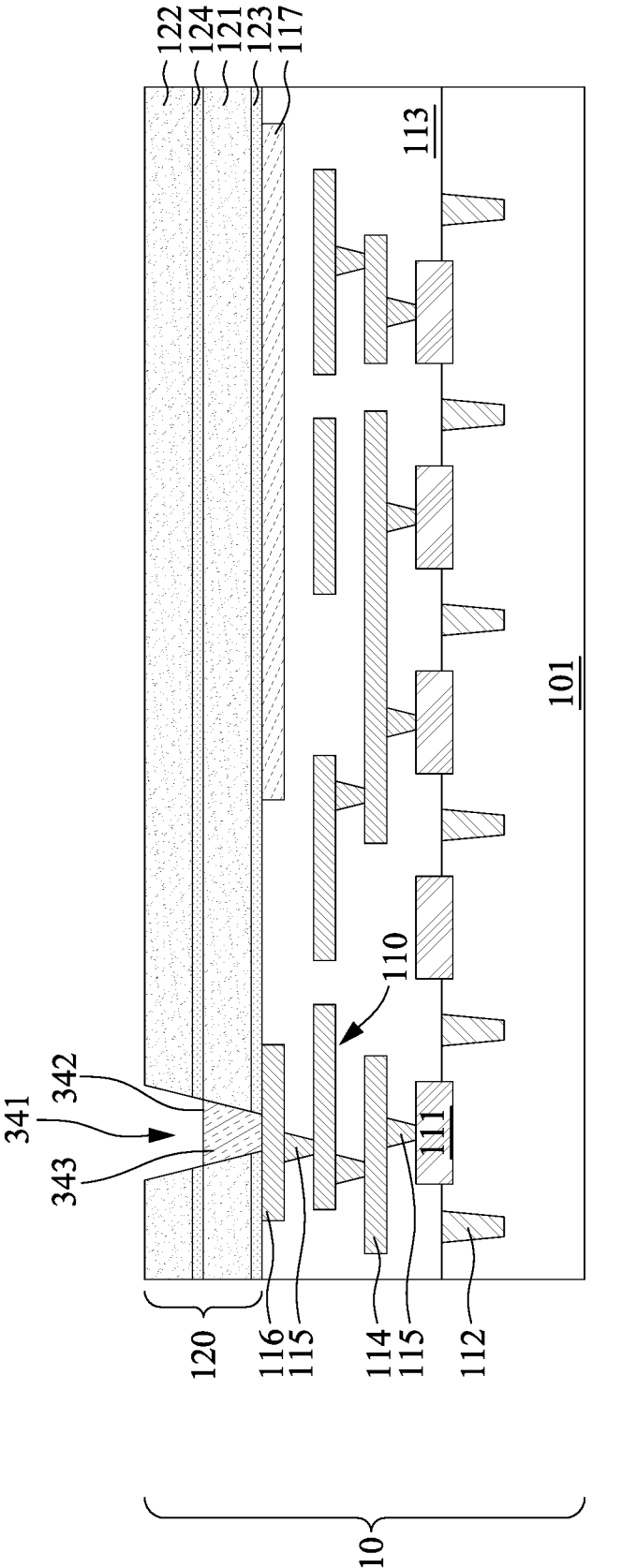

In some embodiments, referring to FIG. 12, a first photoresist fills the first recess 341 and is etched back to a level 342 to form a photoresist plug 343 within the first recess 341. The etching back can be performed by reactive ion etching (RIE), or another type of etching. In some embodiments, the photoresist plug 343 is surrounded by the sub-layer 121. In some embodiments, the photoresist plug 343 includes a non-photosensitive photoresist. In some embodiments, the photoresist plug 343 is a negative photoresist. The negative resist remains on the surface wherever it is exposed, and the developer solution removes only the unexposed portions. The photoresist plug 343 may include any other type of non-deep UV light-sensitive photoresist. In some embodiments, a plurality of photoresist plugs 343 are formed within the corresponding first recesses 341.

Figure 13:
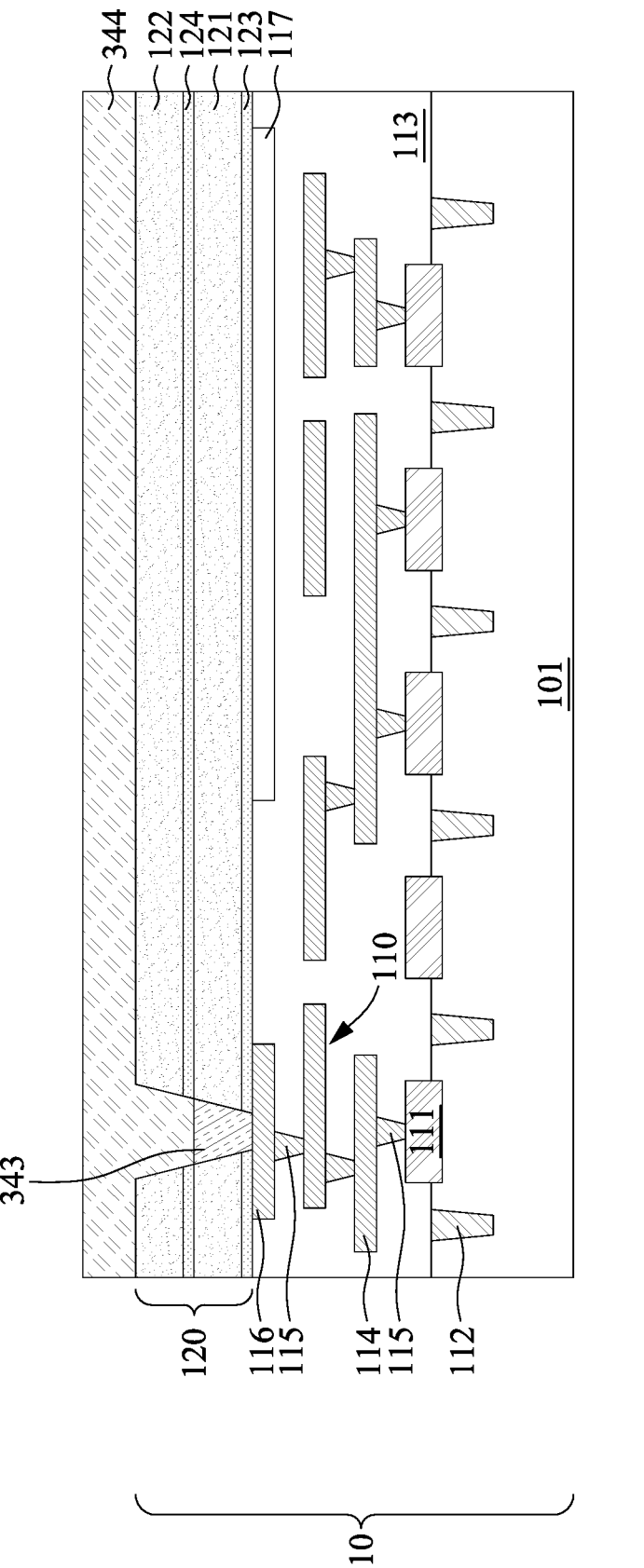

In some embodiments, referring to FIG. 13, a second photoresist 344 is disposed on the first bonding layer 120 and the photoresist plug 343. In some embodiments, a portion of the second photoresist 344 is disposed within the first recess 341 and in contact with the photoresist plug 343. In some embodiments, the second photoresist 344 includes a photosensitive photoresist. In some embodiments, the second photoresist 344 is a positive photoresist. For a positive photoresist, the photoresist exposed to a UV light changes the chemical structure of the photoresist so that it becomes more soluble in the developer. The exposed photoresist is then washed away by the developer solution. In some embodiments, the second photoresist 344 is exposed to a UV light, and the photoresist plug 343 is not responsive to the UV light.

Figure 14:
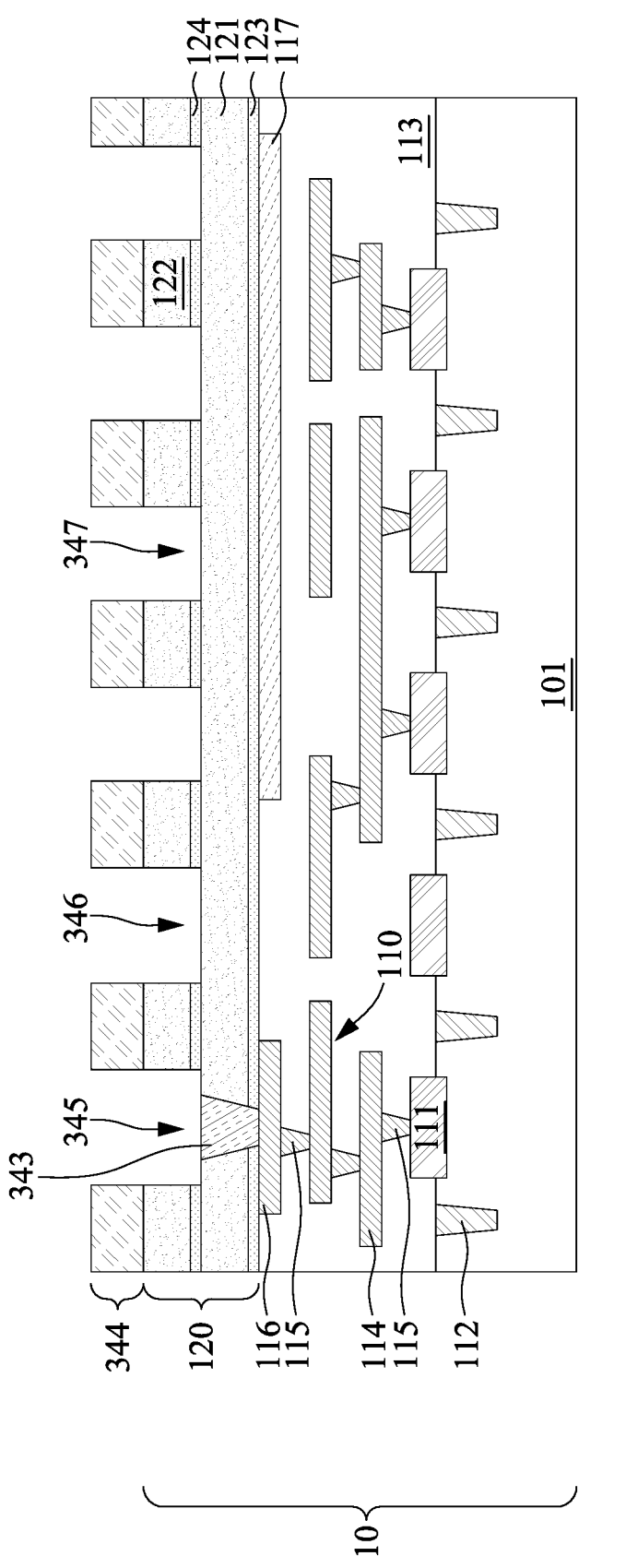

In some embodiments, referring to FIG. 14, a portion of the second photoresist 344 is removed, and a second recess 345, a third recess 346 and a fourth recess 347 are formed within the first bonding layer 120. In some embodiments, the second recess 345, the third recess 346 and the fourth recess 347 are trenches separated from each other. In some embodiments, the second recess 345, the third recess 346 and the fourth recess 347 are formed simultaneously. The portion of the first bonding layer 120 may be removed by a stripping process and/or an etching process to form the second recess 345, the third recess 346 and the fourth recess 347. In some embodiments, the second recess 345, the third recess 346 and the fourth recess 347 are formed to have a depth similar to or less than a thickness of the sub-layer 122 of the first bonding layer 120. In some embodiments, the second recess 345 exposes a portion of the photoresist plug 343. In some embodiments, the third recess 346 and the first magnetic member 117 are offset from a top view. In some embodiments, the fourth recess 347 overlaps at least a portion of the first magnetic member 117 from a top view. In some embodiments, the fourth recess 347 has a coil configuration from a top view perspective. In some embodiments, a plurality of the second recesses 345 are formed.

Figure 15:
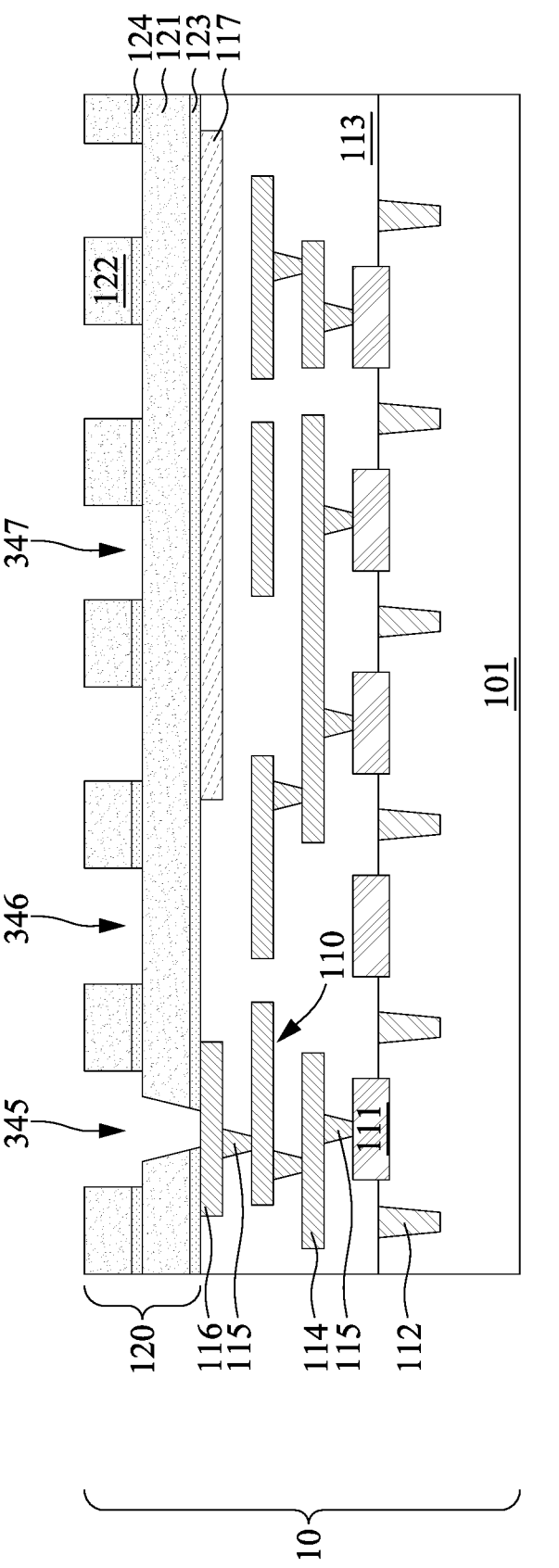

In some embodiments, referring to FIG. 15, the photoresist plug 343 and the second photoresist 344 are removed. In some embodiments, after the removal of the photoresist plug 343, at least a portion of the first conductive pattern 116 is exposed through the second recess 345. In some embodiments, a depth of the second recess 345 is greater than a depth of the fourth recess 347. In some embodiments, the second recess 345 extends through the first bonding layer 120 at this stage.

Figure 16:
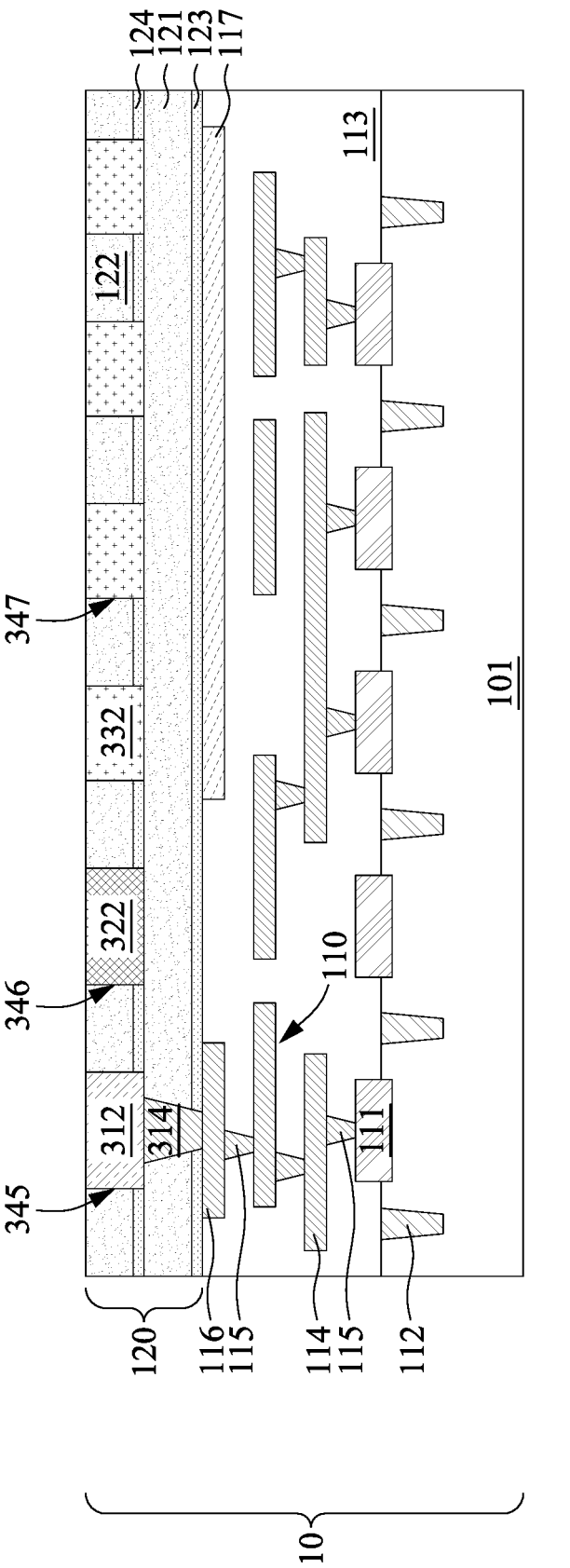

In some embodiments, referring to FIG. 16, a conductive material is disposed within the second recess 345, the third recess 346, and the fourth recess 347. In some embodiments, a conductive via 314 and the first connecting member 312 are formed within the second recess 345 and electrically connected to the first conductive pattern 116. In some embodiments, the first dummy member 322 is formed within the third recess 346 and electrically isolated from the first conductive pattern 116. In some embodiments, the first inductive coil 332 is formed within the fourth recess 347 and is disposed within and extends laterally along the first bonding layer 120. In some embodiments, the first inductive coil 332 is disposed within and extends laterally along the first bonding layer 120 and is adjacent to the first connecting member 312 and the first dummy member 322. In some embodiments, the first inductive coil 332 is disposed over and overlaps the first magnetic member 117 from a top view perspective.

In some embodiments, the conductive via 314 and the first connecting member 312 are formed simultaneously. In some embodiments, formation of the conductive via 314 is prior to the formation of the first connecting member 312. In some embodiments, the first connecting member 312, the first dummy member 322, and the first inductive coil 332 are formed simultaneously. In some embodiments, a planarization operation such as a CMP process is performed to remove an overflow portion of the conductive material to form the first connecting member 312, the first dummy member 322 and the first inductive coil 332. In some embodiments, a top surface of the first connecting member 312, a top surface of the first dummy member 322, and a top surface of the first inductive coil 332 are coplanar with each other.

In some embodiments, a plurality of first connecting members 312 and a plurality of first dummy members 322 are formed within the first bonding layer 120. In some embodiments, a plurality of first inductive coils 332 are formed within and extend laterally along the first bonding layer 120.

Figure 17:
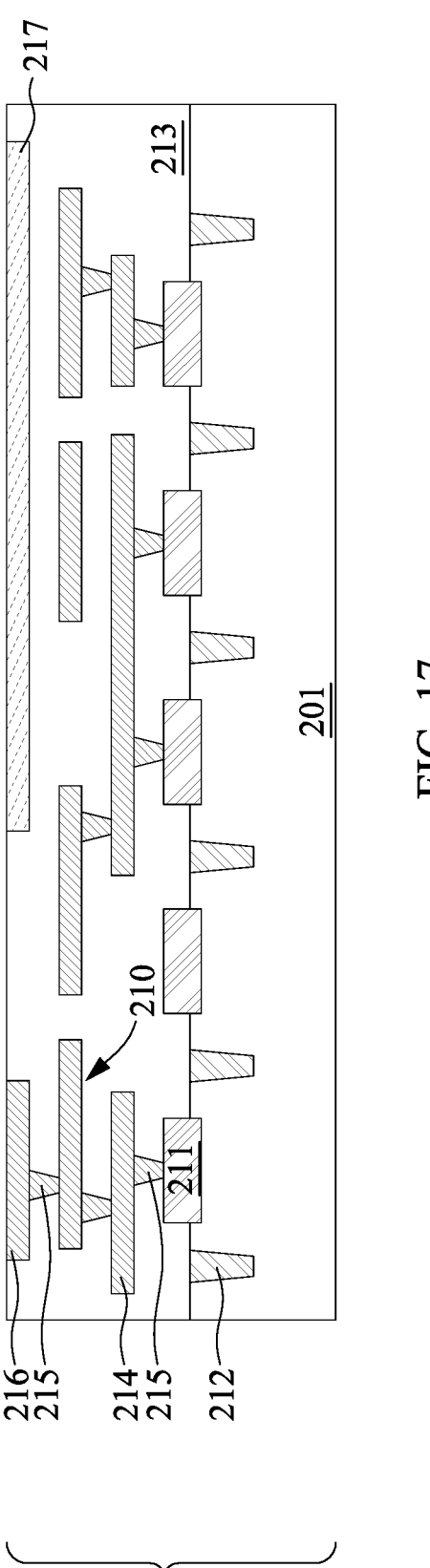

In operation 405, referring to FIG. 17, a second die 20 having a second conductive pattern 216 is provided. In some embodiments, the second conductive pattern 216 is surrounded by a second dielectric layer 213 and electrically connected to a second interconnect structure 210. In some embodiments, at least a portion of the second conductive pattern 216 is exposed through the second dielectric layer 213.

In operation 406, a second magnetic member 217 is formed adjacent to the second conductive pattern 216 in the second die 20. In some embodiments, the second magnetic member 217 is omitted in the second die 20. In some embodiments, the second magnetic member 217 is surrounded by the second dielectric layer 213 and electrically isolated from the second interconnect structure 210. In some embodiments, at least a portion of the second magnetic member 217 is exposed through the second dielectric layer 213.

Figure 18:
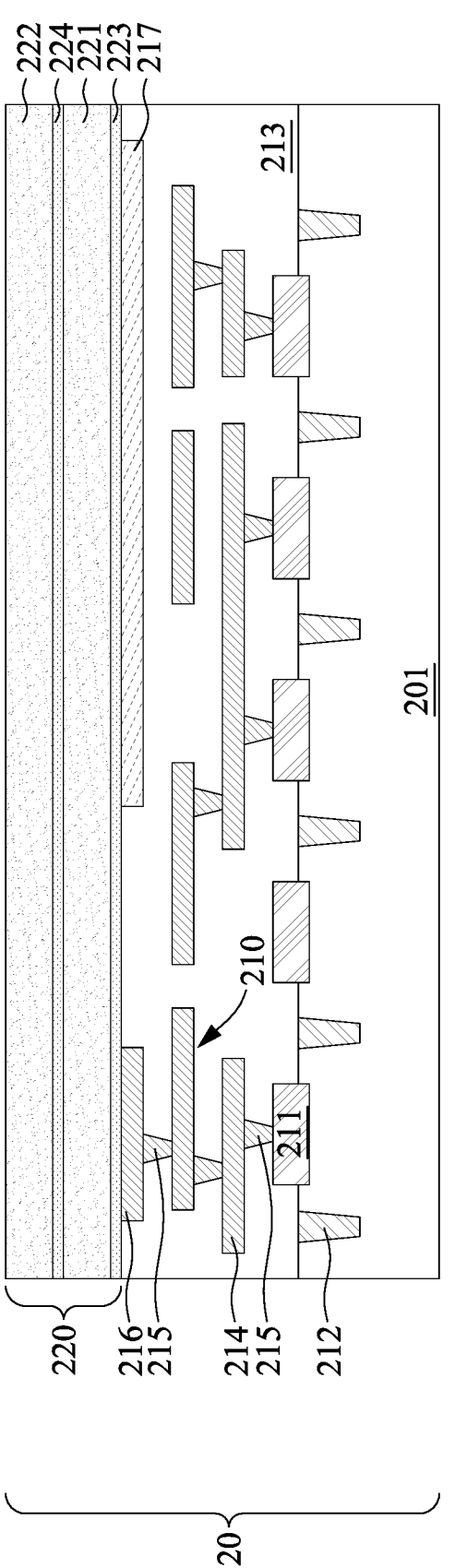

In operation 407, referring to FIG. 18, a second bonding layer 220 is formed over the second conductive pattern 216 and the second magnetic member 217. In some embodiments, an etch stop layer 223 is formed over the second conductive pattern 216 and the second magnetic member 217, a sub-layer 221 including a dielectric material is formed over the etch stop layer 223, an etch stop layer 224 is formed over the sub-layer 221, and a sub-layer 222 including a dielectric material is formed over the etch stop layer 224. The second bonding layer 220 may be formed by suitable fabrication techniques such as spin-on coating, chemical vapor deposition (CVD), plasma-enhanced chemical vapor deposition (PECVD), or the like.

Figure 19:
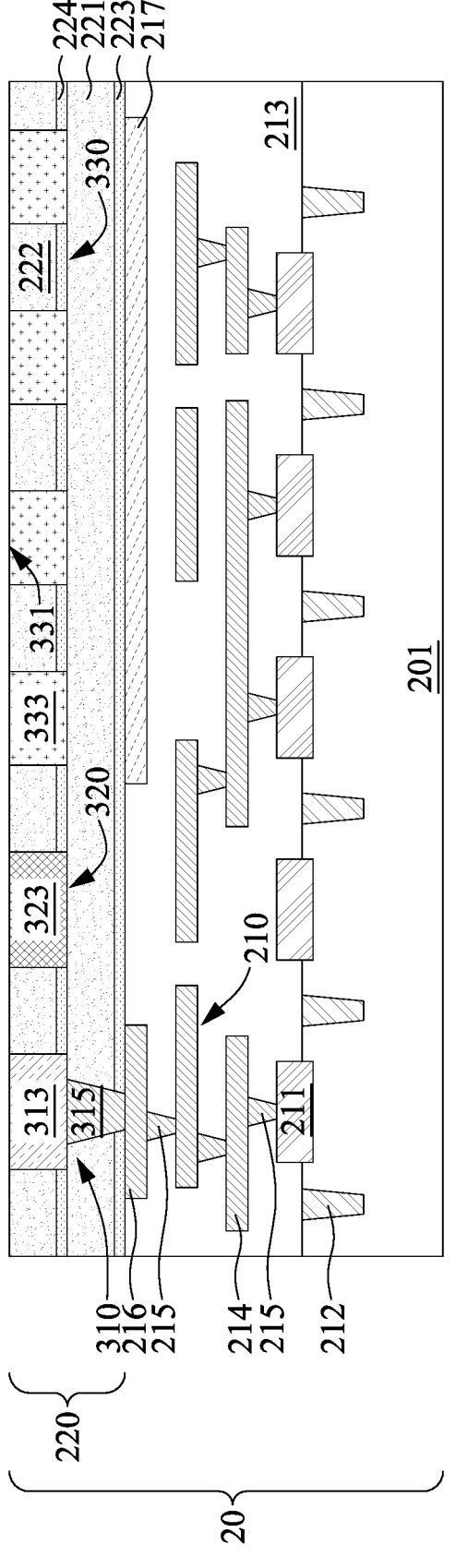

In operation 408, referring to FIG. 19, a second connecting member 313 and a second dummy member 323 are formed within the second bonding layer 220, and a second inductive coil 333 is formed within and extends laterally along the second bonding layer 220, wherein the second connecting member 313 is electrically connected to the second conductive pattern 216, and the second dummy member 323 is electrically isolated from the second conductive pattern 216. In some embodiments, a plurality of second connecting members 313 and a plurality of second dummy members 323 are formed within the second bonding layer 220. In some embodiments, the process of performing operation 408 is similar to the process of performing operation 404, and repeated description is omitted for a sake of brevity.

In some embodiments, the method 400 further includes facing the second bonding layer 220 toward the first bonding layer 120. In some embodiments, the method 400 further includes aligning the first connecting member 312 with the second connecting member 313, aligning the first dummy member 322 with the second dummy member 323, and aligning the first inductive coil 332 with the second inductive coil 333.

Figure 20:
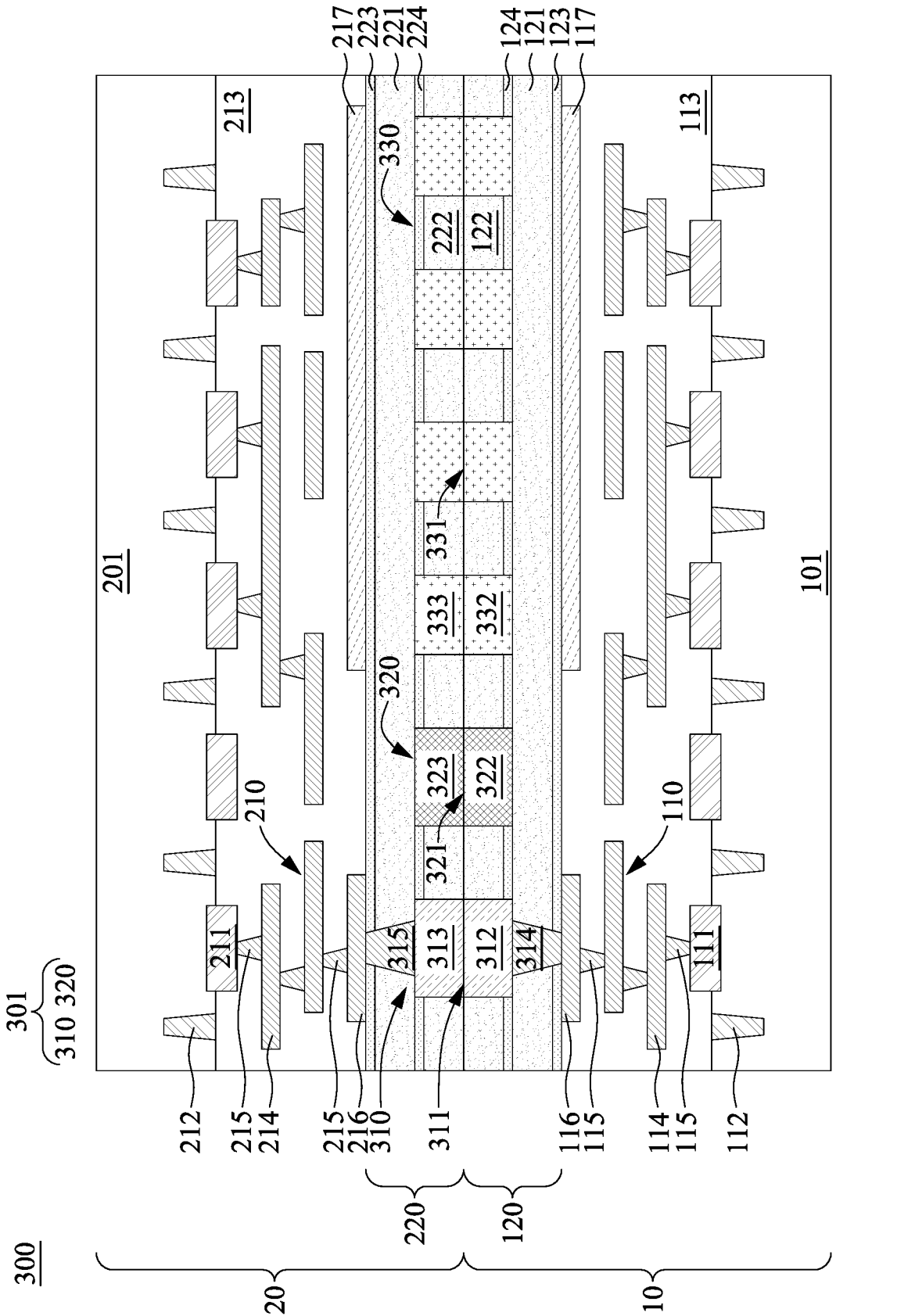

In operation 409, referring to FIG. 20, the first connecting member 312 is bonded to the second connecting member 313 to form a connecting member 310. In some embodiments, the first connecting member 312 is in contact with the second connecting member 313. In some embodiments, a first bonding interface 311 is formed within the connecting member 310 and between the first connecting member 312 and the second connecting member 313.

In operation 410, the first dummy member 322 is bonded to the second dummy member 323 to form a dummy member 320. In some embodiments, the first dummy member 322 is in contact with the second dummy member 323. In some embodiments, a second bonding interface 321 is formed within the dummy member 320 and between the first dummy member 322 and the second dummy member 323.

In operation 411, the first inductive coil 332 is bonded to the second inductive coil 333 to form an inductor 330. In some embodiments, the first inductive coil 332 is in contact with the second inductive coil 333. In some embodiments, the inductor 330 is formed between the first magnetic member 117 and the second magnetic member 217. In some embodiments, a third bonding interface 331 is formed within the inductor 330 and between the first inductive coil 332 and the second inductive coil 333.

In some embodiments, the first bonding layer 120 and the second bonding layer 220 are bonded to each other. In some embodiments, the second die 20 is bonded over the first die 10. In some embodiments, the first die 10 and the second die 20 are hybrid bonded to each other, and the first die 10 is electrically connected to the second die 20 through the connecting member 310. In some embodiments, to achieve the hybrid bonding, the second die 20 is first pre-bonded to the first bonding layer 120 by lightly pressing the second die 20 against the first die 10. An anneal is then performed to cause inter-diffusion of the conductive materials in the first connecting member 312 and the corresponding overlying second connecting member 313, the conductive materials in the first dummy member 322 and the corresponding overlying second dummy member 323, and the conductive materials in the first inductive coil 332 and the corresponding overlying second inductive coil 333.

In some embodiments, after the bonding of the second die 20 over the first die 10, the connecting member 310 and the inductor 330 are formed simultaneously. In some embodiments, the connecting member 310, the dummy member 320, and the inductor 330 are formed simultaneously. In some embodiments, operation 409, operation 410 and operation 411 are performed simultaneously. In some embodiments, the plurality of connecting members 310, the plurality of dummy members 320, and the inductor 330 are formed simultaneously. In some embodiments, the semiconductor device 300 is formed.

In some embodiments, the semiconductor devices 100, 200, 300 are fabricated by a method 500. The method 500 includes a number of operations and the description and illustration are not deemed as a limitation to the sequence of operations. FIG. 21 is an embodiment of the method 500 of manufacturing the semiconductor device 100. The method 500 includes a number of operations (501 to 508).

In operation 501, a first die having a first conductive pattern is provided. In operation 502, a first bonding layer is formed over the first conductive pattern. In operation 503, a first connecting member is formed within the first bonding layer, and a first inductive coil is formed within and extends laterally along the first bonding layer. In operation 504, a second die having a second conductive pattern is provided. In operation 505, a second bonding layer is formed over the second conductive pattern. In operation 506, a second connecting member is formed within the second bonding layer, and a second inductive coil is formed, wherein the second inductive coil is disposed within and extends laterally along the second bonding layer. In operation 507, the first connecting member is bonded to the second connecting member to form a connecting member. In operation 508, the first inductive coil is bonded to the second inductive coil to form an inductor, wherein the first connecting member is electrically connected to the first conductive pattern, and the second connecting member is electrically connected to the second conductive pattern.

One aspect of this disclosure relates to a semiconductor device. The semiconductor device includes a first die having a first bonding layer; a second die having a second bonding layer disposed over and bonded to the first bonding layer; a plurality of bonding members, wherein each of the plurality of bonding members extends within the first bonding layer and the second bonding layer, and the plurality of bonding members includes a connecting member electrically connected to a first conductive pattern in the first die and a second conductive pattern in the second die, and a dummy member electrically isolated from the first conductive pattern and the second conductive pattern; and an inductor disposed within the first bonding layer and the second bonding layer.

In some embodiments, the connecting member and the dummy member are disposed adjacent to the inductor. In some embodiments, a first bonding interface is disposed within the connecting member, and a second bonding interface is disposed within the dummy member and is substantially coplanar with the first bonding interface. In some embodiments, a third bonding interface is disposed within the inductor and is substantially coplanar with the first bonding interface. In some embodiments, the inductor is disposed between the first conductive pattern and the second conductive pattern. In some embodiments, the inductor has a coil configuration from a top view perspective. In some embodiments, a distance between the inductor and an adjacent one of the bonding members is between 0.4 µm and 10 µm. In some embodiments, the first die further includes a first magnetic member disposed adjacent to the first conductive pattern and overlapped by the inductor from a top view perspective. In some embodiments, the second die further includes a second magnetic member disposed adjacent to the second conductive pattern, wherein the inductor is disposed between the first magnetic member and the second magnetic member, and the inductor is overlapped by the second magnetic member from a top view perspective.

One aspect of this disclosure relates to a semiconductor device. The semiconductor device includes a first die having a first bonding layer; a second die having a second bonding layer bonded over the first bonding layer; a plurality of first bonding members disposed within the first bonding layer; a plurality of second bonding members disposed within the second bonding layer and bonded with the plurality of first bonding members respectively; an inductor having a first inductive coil disposed within the first bonding layer, and a second inductive coil disposed within the second bonding layer, wherein the second inductive coil is bonded over the first inductive coil.

In some embodiments, the first inductive coil is vertically aligned with the second inductive coil. In some embodiments, the plurality of first bonding members include a first connecting member electrically connected to a first conductive pattern in the first die and a first dummy member electrically isolated from the first conductive pattern, and the plurality of second bonding members include a second connecting member electrically connected to a second conductive pattern in the second die and a second dummy member electrically isolated from the second conductive pattern. In some embodiments, the second connecting member is bonded over and aligned with the first connecting member. In some embodiments, the second dummy member is bonded over and aligned with the first dummy member.

An aspect of this disclosure relates to a method of manufacturing a semiconductor device. The method includes providing a first die having a first conductive pattern; forming a first bonding layer over the first conductive pattern; forming a first connecting member within the first bonding layer, and a first inductive coil disposed within the first bonding layer; providing a second die having a second conductive pattern; forming a second bonding layer over the second conductive pattern; forming a second connecting member within the second bonding layer, and a second inductive coil disposed within the second bonding layer; bonding the first connecting member to the second connecting member to form a connecting member; and bonding the first inductive coil to the second inductive coil to form an inductor. The first connecting member is electrically connected to the first conductive pattern, and the second connecting member is electrically connected to the second conductive pattern.

In some embodiments, the connecting member and the inductor are formed simultaneously. In some embodiments, the method further includes forming a first dummy member electrically isolated from the first conductive pattern and disposed within the first bonding layer; forming a second dummy member electrically isolated from the second conductive pattern and disposed within the second bonding layer; and bonding the first dummy member to the second dummy member to form a dummy member. In some embodiments, the dummy member, the connecting member and the inductor are formed simultaneously. In some embodiments, the method further includes forming a first magnetic member adjacent to the first conductive pattern in the first die. In some embodiments, the method further includes forming a second magnetic member adjacent to the second conductive pattern in the second die, wherein the second connecting member is disposed over and overlaps the second conductive pattern layer from a top view perspective, and the second inductive coil is disposed over and overlaps the second magnetic member from a top view perspective.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first die having a first bonding layer;
a second die having a second bonding layer disposed over and bonded to the first bonding layer;
a plurality of bonding members, wherein each of the plurality of bonding members extends within the first bonding layer and the second bonding layer, wherein the plurality of bonding members include a connecting member electrically connected to a first conductive pattern in the first die and a second conductive pattern in the second die, and a dummy member electrically isolated from the first conductive pattern and the second conductive pattern;
an inductor coil disposed within the first bonding layer and the second bonding layer; and
wherein the inductor coil comprises an uppermost surface and lowermost surface that are respectively aligned with an uppermost surface and lowermost surface of the plurality of bonding members.

2. The semiconductor device of claim 1, wherein the connecting member and the dummy member are disposed adjacent to the inductor coil and laterally offset from an outermost perimeter of the inductor coil.

3. The semiconductor device of claim 1, wherein a first bonding interface is disposed within the connecting member, and a second bonding interface is disposed within the dummy member and is substantially coplanar with the first bonding interface.

4. The semiconductor device of claim 3, wherein a third bonding interface is disposed within the inductor coil and is substantially coplanar with the first bonding interface.

5. The semiconductor device of claim 1, wherein the inductor coil is between the first conductive pattern and the second conductive pattern.

6. The semiconductor device of claim 1, wherein the inductor has a coil comprises a strip having a rectangular shape from a cross-sectional view perspective.

7. The semiconductor device of claim 1, wherein a distance between the inductor coil and an adjacent one of the bonding members is between 0.4 $\mu$m and 10 $\mu$m.

8. The semiconductor device of claim 1, wherein the first die further includes a first magnetic member disposed adjacent to the first conductive pattern and overlapped by the inductor coil from a top view perspective.

9. The semiconductor device of claim 8, wherein the second die further includes a second magnetic member disposed adjacent to the second conductive pattern, the inductor coil is disposed vertically between the first magnetic member and the second magnetic member, and the inductor coil is overlapped by the second magnetic member from a top view perspective.

10. A semiconductor device, comprising:
a first die having a first bonding layer;
a second die having a second bonding layer bonded over the first bonding layer;
a plurality of first bonding members disposed within the first bonding layer;
a plurality of second bonding members disposed within the second bonding layer and bonded with the plurality of first bonding members respectively;

an inductor having a first inductive coil disposed within the first bonding layer, and a second inductive coil disposed within the second bonding layer;;

wherein the second inductive coil is bonded over the first inductive coil; and wherein the first inductive coil and the second inductive coil contact one another at a bonding interface, and wherein the bonding interface is a coil-shaped surface that is shared between the first inductive coil and the second inductive coil.

11. The semiconductor device of claim 10, wherein the first inductive coil is vertically aligned with the second inductive coil.

12. The semiconductor device of claim 10, wherein the plurality of first bonding members include a first connecting member electrically connected to a first conductive pattern in the first die and a first dummy member electrically isolated from the first conductive pattern, and the plurality of second bonding members include a second connecting member electrically connected to a second conductive pattern in the second die and a second dummy member electrically isolated from the second conductive pattern.

13. The semiconductor device of claim 12, wherein the second connecting member is bonded over and aligned with the first connecting member.

14. The semiconductor device of claim 12, wherein the second dummy member is bonded over and aligned with the first dummy member.

15. A semiconductor device, comprising:

a first die having a first bonding layer and a first conductive pattern;

a second die having a second bonding layer and a second conductive pattern, the second bonding layer disposed over and bonded to the first bonding layer;

a plurality of bonding members, wherein each of the plurality of bonding members extends within the first bonding layer and the second bonding layer, wherein the plurality of bonding members include a connecting member electrically connected to the first conductive pattern and the second conductive pattern, and a dummy member electrically isolated from the first conductive pattern and the second conductive pattern;

a first inductor coil disposed within the first bonding layer and including multiple segments that establish a first coil pattern;

a second inductor coil disposed within the second bonding layer, the second inductor coil disposed over the first inductor coil and including multiple segments that establish a second coil pattern;

a first magnetic member disposed below the first inductor coil; and a second magnetic member disposed over the second inductor coil and vertically separated from the first magnetic member by the first inductor coil and the second inductor coil.

16. The semiconductor device of claim 15, wherein the dummy member laterally separates the first conductive pattern and the second conductive pattern from the first inductor coil and the second inductor coil.

17. The semiconductor device of claim 15, wherein the first magnetic member and the second magnetic member are respectively laterally aligned with the first conductive pattern and the second conductive pattern.

18. The semiconductor device of claim 15, wherein the dummy member laterally separates the first magnetic member and the second magnetic member from the connecting member.

19. The semiconductor device of claim 15, wherein the first inductor coil is laterally enclosed by an outer perimeter of the first magnetic member in top view.

20. The semiconductor device of claim 19, wherein the second inductor coil is laterally enclosed by an outer perimeter of the second magnetic member in top view.

* * * * *